(12) United States Patent
Lai et al.

(10) Patent No.: US 11,769,698 B2
(45) Date of Patent: Sep. 26, 2023

(54) METHOD OF TESTING SEMICONDUCTOR PACKAGE

(71) Applicant: TAIWAN SEMICONDUCTOR MANUFACTURING COMPANY LTD., Hsinchu (TW)

(72) Inventors: Chi-Hui Lai, Taichung (TW); Yang-Che Chen, Hsin-Chu (TW); Chen-Hua Lin, Yunlin County (TW); Victor Chiang Liang, Hsinchu (TW); Chwen-Ming Liu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 248 days.

(21) Appl. No.: 17/378,435

(22) Filed: Jul. 16, 2021

(65) Prior Publication Data

US 2023/0019013 A1     Jan. 19, 2023

(51) Int. Cl.
| | |
|---|---|
| *H01L 21/768* | (2006.01) |
| *H01L 21/66* | (2006.01) |
| *H01L 23/31* | (2006.01) |
| *H01L 23/538* | (2006.01) |
| *H01L 23/00* | (2006.01) |

(Continued)

(52) U.S. Cl.
CPC ............ *H01L 22/20* (2013.01); *G01R 31/002* (2013.01); *H01L 21/4853* (2013.01); *H01L 21/4857* (2013.01); *H01L 21/565* (2013.01); *H01L 21/568* (2013.01); *H01L 21/6835* (2013.01); *H01L 23/3128* (2013.01); *H01L 23/5383* (2013.01); *H01L 23/5386* (2013.01); *H01L 24/19* (2013.01); *H01L 24/20* (2013.01); *H01L 2221/68372* (2013.01); *H01L 2224/214* (2013.01)

(58) Field of Classification Search
CPC . H01L 22/20; H01L 21/4853; H01L 21/4857; H01L 21/565; H01L 21/568; H01L 21/6835; H01L 23/3128; H01L 23/5383; H01L 23/5386; H01L 24/19; H01L 24/20; H01L 2221/68372; H01L 2224/214; H01L 23/49816; H01L 22/00; H01L 23/5389; G01R 31/002
USPC ............................................................ 438/5
See application file for complete search history.

(56) References Cited

U.S. PATENT DOCUMENTS

| | | | | |
|---|---|---|---|---|
| 6,696,849 B2* | 2/2004 | Ban | ................... | G01R 31/2831 |
| | | | | 324/750.05 |
| 6,815,231 B2* | 11/2004 | Miura | ................... | G11C 29/50 |
| | | | | 257/E21.68 |

(Continued)

*Primary Examiner* — Vu A Vu
(74) *Attorney, Agent, or Firm* — WPAT LAW; Anthony King

(57) ABSTRACT

A method of testing a semiconductor package is provided. The method includes forming a first metallization layer, wherein the first metallization layer includes a first conductive pad electrically connected to a charge measurement unit and a charge receiving unit; performing a first test against the charge measurement unit through the first conductive pad to determine whether breakdown occurs in the charge measurement unit; and in response to determining that no breakdown occurs in the charge measurement unit, forming a second dielectric layer over the first metallization layer, wherein a portion of the first conductive pad is exposed from the second dielectric layer.

20 Claims, 25 Drawing Sheets

(51) Int. Cl.
  *H01L 21/48* (2006.01)
  *H01L 21/56* (2006.01)
  *G01R 31/00* (2006.01)
  *H01L 21/683* (2006.01)

(56) References Cited

U.S. PATENT DOCUMENTS

| | | | | |
|---|---|---|---|---|
| 7,662,648 B2 * | 2/2010 | Sandhu | ............... | B82Y 15/00 |
| | | | | 438/17 |
| 7,825,679 B2 * | 11/2010 | Martin | ............... | H01L 22/34 |
| | | | | 324/754.08 |
| 8,211,716 B2 * | 7/2012 | Shinkawata | ....... | G01R 31/2884 |
| | | | | 257/E21.524 |
| 10,211,168 B1 * | 2/2019 | Chavali | ............... | H01L 23/60 |

* cited by examiner

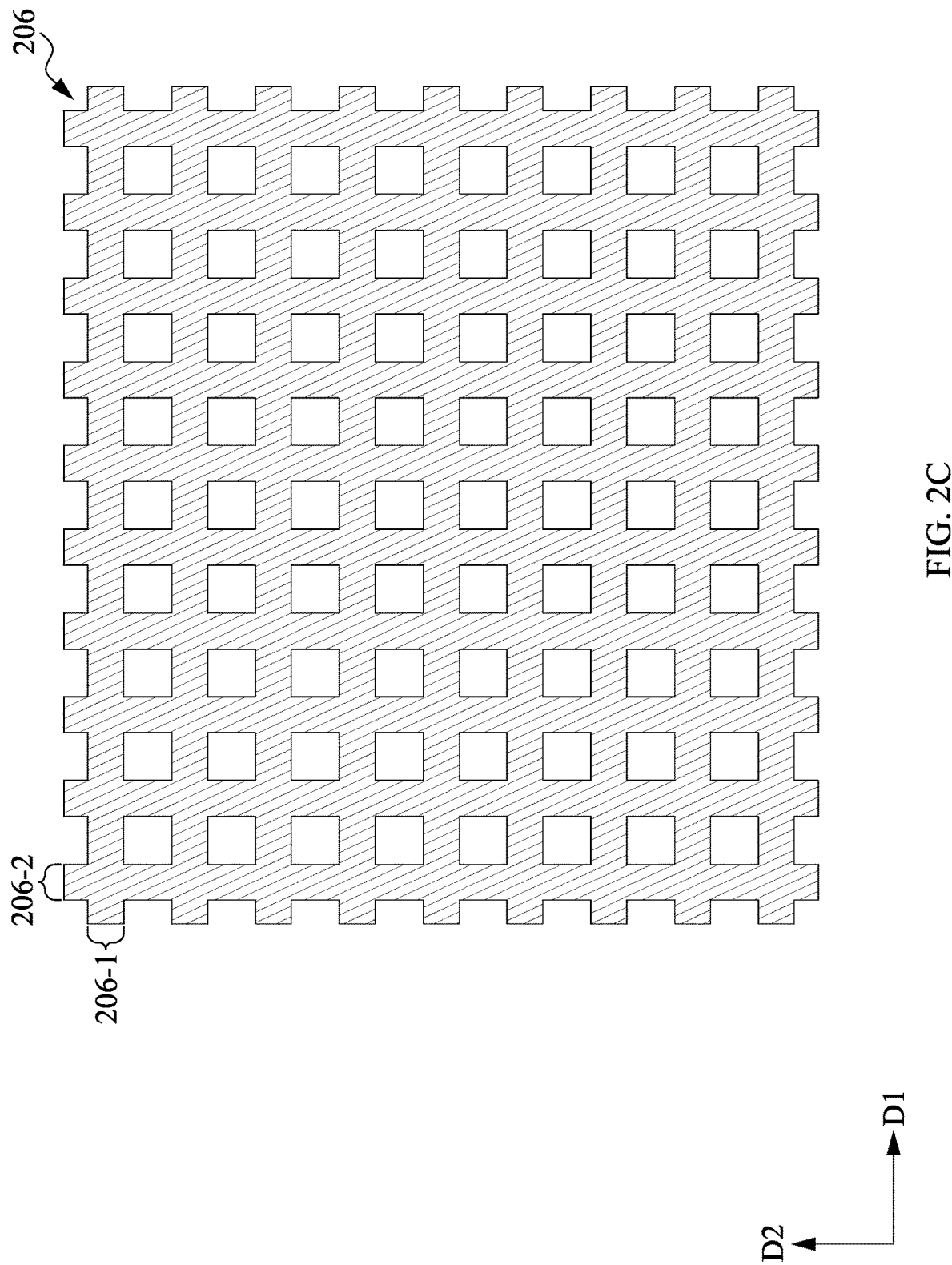

METHOD OF TESTING SEMICONDUCTOR PACKAGE

BACKGROUND

As semiconductor packages are formed by a plurality of layers having varying process techniques, high-voltage static electricity or noise, commonly referred to as electrostatic discharge (ESD), can pass through the semiconductor packages during the forming processes. ESD is generally defined as a sudden and momentary electric current that flows between two objects at different electrical potentials. ESD can damage devices fabricated in the semiconductor package causing performance degradation or failures.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

FIGS. 2A through 2E are schematic drawings illustrating cross-sectional views or top views of a charge receiving unit at different fabrication stages constructed according to aspects of one or more embodiments of the present disclosure.

DETAILED DESCRIPTION

Figure 1:
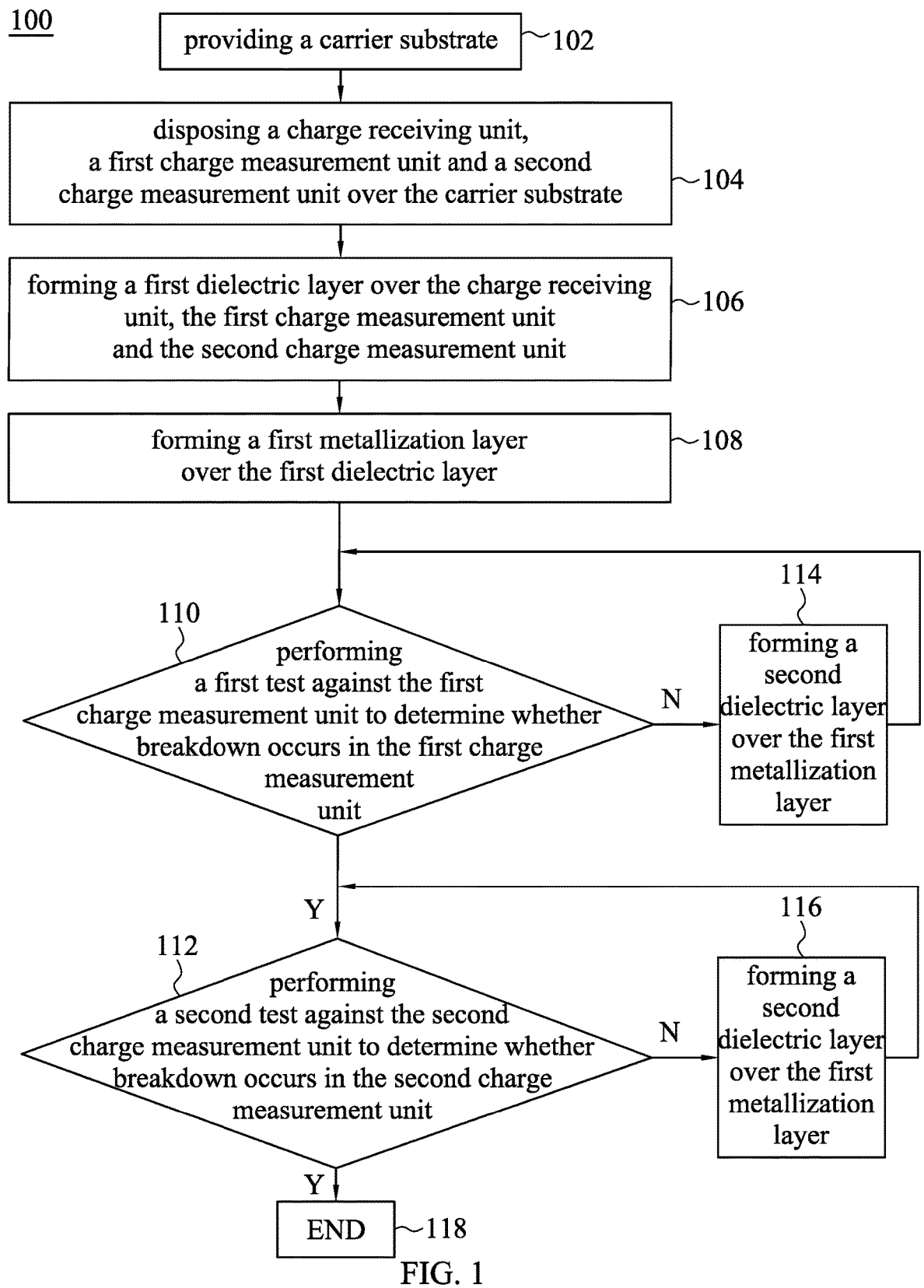
FIG. 1 is a flowchart representing a method for testing a semiconductor package according to aspects of one or more embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "con," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation.

An integrated fan-out (InFO) package fabrication involves numerous steps including photolithography, material deposition, and etching. High-voltage static electricity or noise, commonly referred to as electrostatic discharge (ESI)), may arise during the intricate InFO package fabrication process. In an InFO package, a redistribution structure is formed on a side of a semiconductor die and is electrically coupled to the semiconductor die. The present disclosure is generally directed to testing the ESD accumulated on the redistribution structure of the InFO packages during manufacturing of the semiconductor packages.

FIG. 1 is a flowchart representing a method 100 for testing a semiconductor package according to aspects of one or more embodiments of the present disclosure. The method 100 includes an operation 102 where a carrier substrate is provided. The method 100 further includes an operation 104 where a charge receiving unit, a first charge measurement unit and a second charge measurement unit are disposed over the carrier substrate. The method 100 further includes an operation 106 where a first dielectric layer is formed over the charge receiving unit, the first charge measurement unit and the second charge measurement unit. The method 100 further includes an operation 108 where a first metallization layer is formed over the first dielectric layer. The method 100 further includes an operation 110 where a first test is performed against the first charge measurement unit to determine whether breakdown occurs in the first charge measurement unit. The method 100 further includes an operation 112 where a second test is performed against the second charge measurement unit to determine whether breakdown occurs in the second charge measurement unit, in response to determining that breakdown occurs in the first charge measurement unit. The method 100 further includes an operation 114 where a second dielectric layer is formed over the first metallization layer in response to determining that no breakdown occurs in the first charge measurement unit. The method 100 further includes an operation 116 where a second dielectric layer is formed over the first metallization layer in response to determining that no breakdown occurs in the second charge measurement unit. In some embodiments, the second dielectric layer is formed over the first metallization layer in response to determining that breakdown occurs only in the first charge measurement unit rather than in the second charge measurement unit.

FIGS. 2A through 2E are schematic drawings illustrating cross-sectional views or top views of a charge receiving unit 200 at different fabrication stages constructed according to aspects of one or more embodiments of the present disclosure.

Figure 2A:
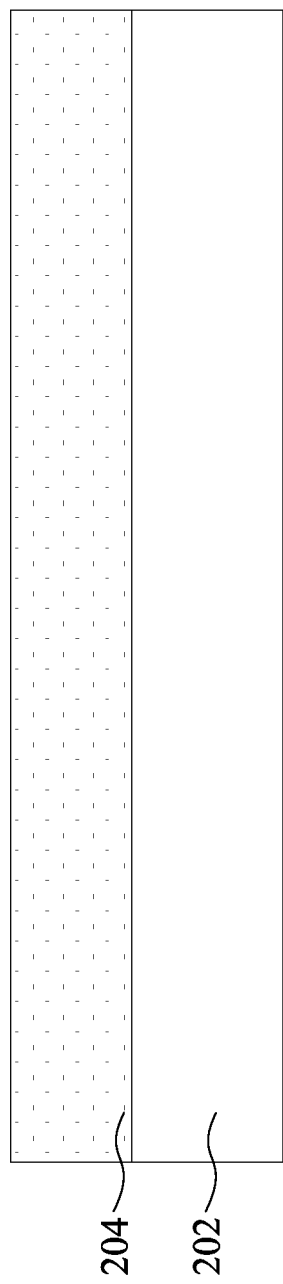

Referring to FIG. 2A, a substrate 202 is received or formed. The substrate 202 may be a semiconductor wafer such as a silicon wafer. Alternatively or additionally, the substrate 202 may include elementary semiconductor materials, compound semiconductor materials, or alloy semiconductor materials. Examples of elementary semiconductor materials may be, for example but not limited thereto, single crystal silicon, polysilicon, amorphous silicon, germanium (Ge), and/or diamond. Examples of compound semiconductor materials may be, for example but not limited thereto, silicon carbide (SiC), gallium arsenic (GaAs), gallium phosphide (GaP), indium phosphide (InP), indium arsenide (InAs), and/or indium antimonide (InSb). Examples of alloy semiconductor material may be, for example but not limited thereto, SiGe, GaAsP, AlInAs, AlGaAs, GaInAs, GaInP, and/or GaInAsP. The substrate 202 may also be a bulk semiconductor substrate or a semiconductor-on-insulator (SOI) substrate. In some embodiments, the substrate 202 is doped with p-type impurities or n-type impurities.

Still Referring to FIG. 2A, a dielectric layer 204 is formed over the substrate 202. The dielectric layer 204 may be an inter-layer dielectric (ILD) layer or an inter-metal dielectric (IMD) layer. The dielectric layer 204 may be blanket formed over the substrate 202. The dielectric layer 204 may be formed using a deposition technique, for example, chemical vapor deposition (CVD). The dielectric layer 204 may also be a spin-on glass formed using spin-on coating. For example, the dielectric layer 204 may be formed of phospho-silicate glass (PSG), boro-silicate glass (BSG), boron-doped phospho-silicate glass (BPSG), tetraethyl orthosilicate (TEOS) oxide, SiOC, or other low-k dielectric materials. In alternative embodiments, the dielectric layer 204 includes silicon oxide, and other dielectric materials such as SiN, SiC, SiON, or the like, may also be used.

Figure 2B:
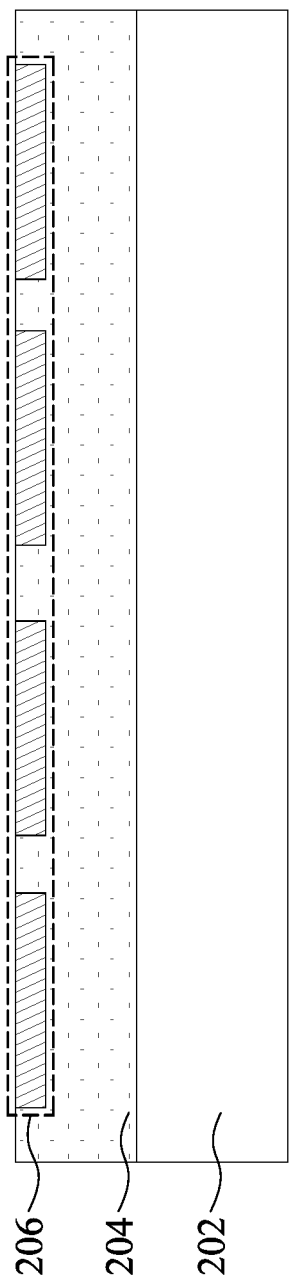

Referring to FIG. 2B, a charge receiving element 206 is formed over the substrate 202. In some embodiments, the charge receiving element 206 is formed in the dielectric layer 204. The formation of charge receiving element 206 may include patterning the dielectric layer 204 and depositing a seed layer (such as a titanium layer and an overlying copper layer, which are not shown) over dielectric layer 204. A patterned photo resist (not shown) is then formed over the seed layer, and a metallic material is plated in the pattern of the patterned photo resist. The photo resist is then removed, and the portions of the seed layer covered by the photo resist are removed. The remaining portions of the plated metallic material form the pattern of the charge receiving element 206. The charge receiving element 206 may be formed of conductive materials, such as copper, tungsten, aluminum or other suitable conductive materials. In some embodiments, the conductive layer in which the charge receiving element 206 resides is referred to herein as a top metal layer.

FIG. 2C illustrates a top view of the charge receiving element 206. Referring to FIG. 2C, the charge receiving element 206 may be arranged in a mesh layout. In some embodiments, the charge receiving element 206 includes a conductive mesh. The charge receiving element 206 may include a plurality of first conductive segments 206-1 extending in a first direction D1 and a plurality of second conductive segments 206-2 extending in a second direction D2. The first conductive segments 206-1 are arranged in parallel to each other. The second conductive segments 206-2 are arranged in parallel to each other. In some embodiments, the first direction D1 is perpendicular to the second direction D2.

Figure 2D:
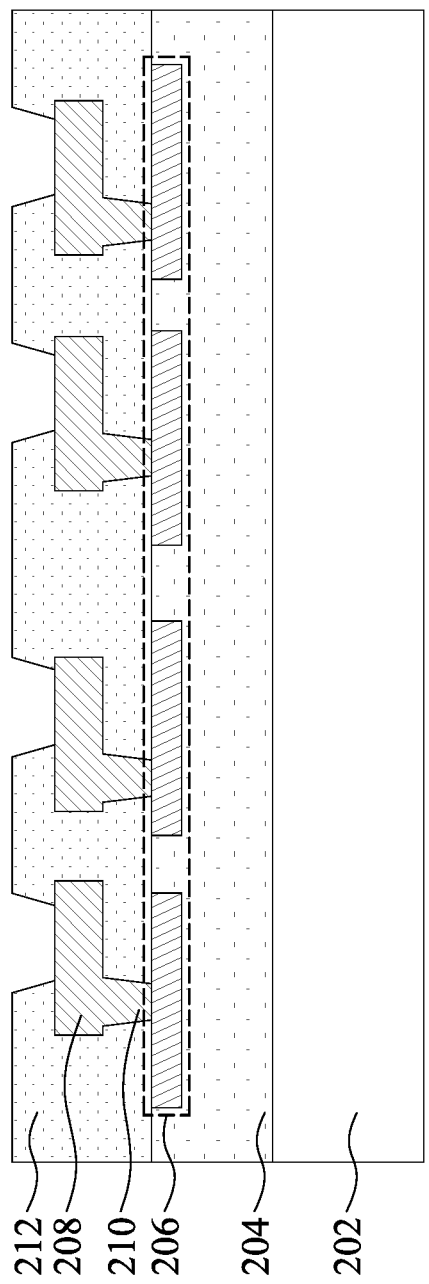

Referring to FIG. 2D, a plurality of conductive pads 208, a plurality of conductive vias 210 and a passivation layer 212 are formed over the substrate 202. In some embodiments, the conductive pads 208, the conductive vias 210 and the passivation layer 212 are formed over the charge receiving element 206 and the dielectric layer 204. In some embodiments, a first portion of the passivation layer 212 is formed over the dielectric layer 204 and has openings that partially expose the conductive pads 208 on the dielectric layer 204. The conductive pads 208 may be aluminum pads, copper pads or other suitable metal pads. The passivation layer 212 may be a silicon oxide layer, a silicon nitride layer, a silicon oxy-nitride layer or a dielectric layer formed of any suitable dielectric materials. In some embodiments, the conductive vias 210 are formed on the charge receiving element 206 by suitable techniques such as plating, CVD, atomic layer deposition (ALD) or the like. As illustrated in FIG. 2D, each of the conductive vias 210 is respectively disposed on the corresponding conductive segments 206-1 or 206-2 of the charge receiving element 206. The conductive pads 208 are disposed on the conductive vias 210. The conductive pads 208 are electrically connected to the charge receiving element 206 through the conductive vias 210. In some embodiments, a second portion of the passivation layer 212 is then formed and patterned on the first portion of the passivation layer 212 and exposes portions of the conductive pads 208.

Figure 2E:
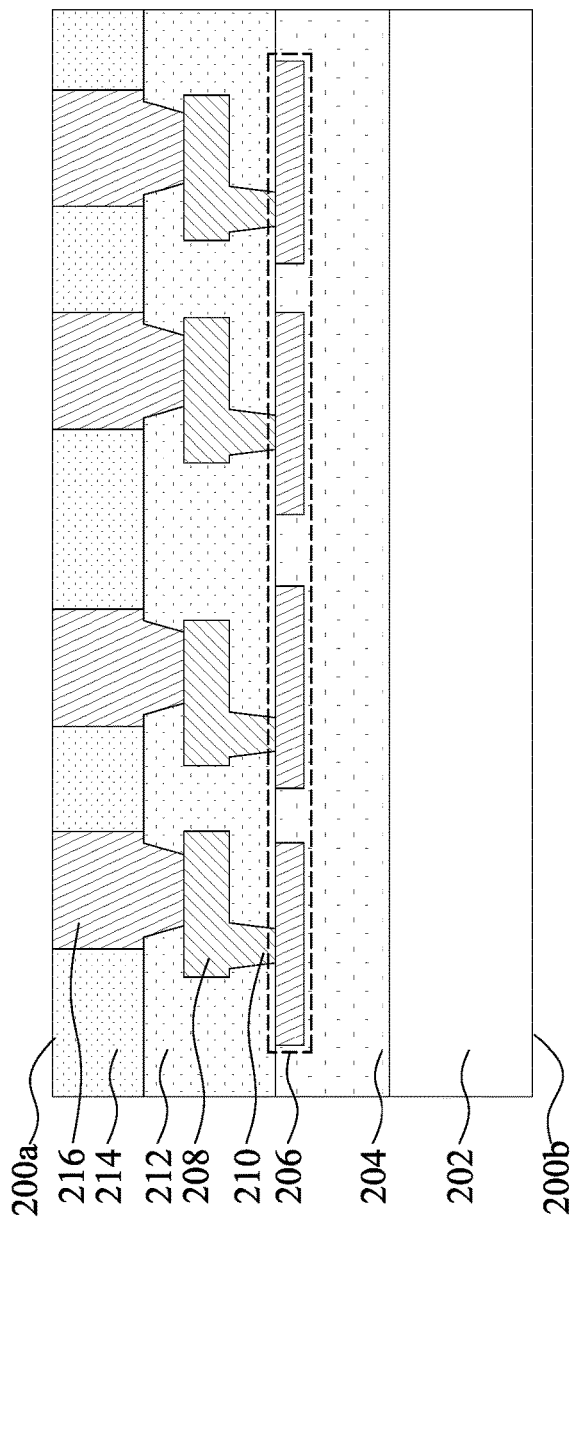

Referring to FIG. 2E, in some embodiments, a post passivation layer 214 is formed over the passivation layer 212. The post passivation layer 214 may cover the passivation layer 212 and may be patterned to include a plurality of contact openings. The conductive pads 208 are partially exposed by the contact openings of the post passivation layer 214. The post passivation layer 214 may be a benzo-cyclobutene (BCB) layer, a polyimide (PI) layer, a polyben-zoxazole (PBO) layer, or a dielectric layer formed of other suitable polymers. In some embodiments, conductive posts (or conductive vias) 216 are formed on the conductive pads 208 by suitable techniques such as plating. In some embodiments, the post passivation layer 214 covers the top surfaces of the conductive posts 216 so as to protect the conductive posts 216. In alternative embodiments, a protection layer (not shown) is formed on the post passivation layer 214, covering the top surfaces of the conductive posts 216 so as to protect the conductive posts 216. In some embodiments, the post passivation layer 214 and the conductive posts 216 are ground or polished by a planarization step. For example, the planarization step is performed through a mechanical grinding process and/or a chemical mechanical polishing (CMP) process until the top surfaces of the conductive posts 216 are revealed.

Based on the operations with reference to FIGS. 2A to 2E, a charge receiving unit 200 is thus formed. The charge receiving unit 200 includes the substrate 202, the dielectric layer 204, the charge receiving element 206, the conductive pads 208, the conductive vias 210, the passivation layer 212, the post passivation layer 214 and the conductive posts 216. The charge receiving unit 200 has a front surface 200a and a back surface 200b opposite to the front surface 200a. The charge receiving element 206 is configured to receive and/or collect charges during the manufacturing operations for forming the redistribution structure of the InFO package, as will be illustrated and discussed later with reference to FIGS. 5A-5I.

FIGS. 3A through 3E are schematic drawings illustrating cross-sectional views or top views of a charge measurement unit 300 at different fabrication stages constructed according to aspects of one or more embodiments of the present disclosure.

Figure 3A:
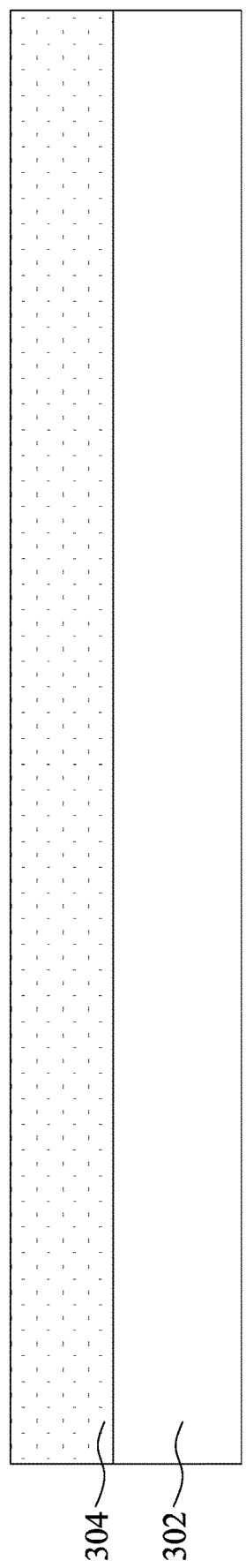
FIGS. 3A through 3E are schematic drawings illustrating cross-sectional views or top views of a charge measurement unit at different fabrication stages constructed according to aspects of one or more embodiments of the present disclosure.
Figure 3B:
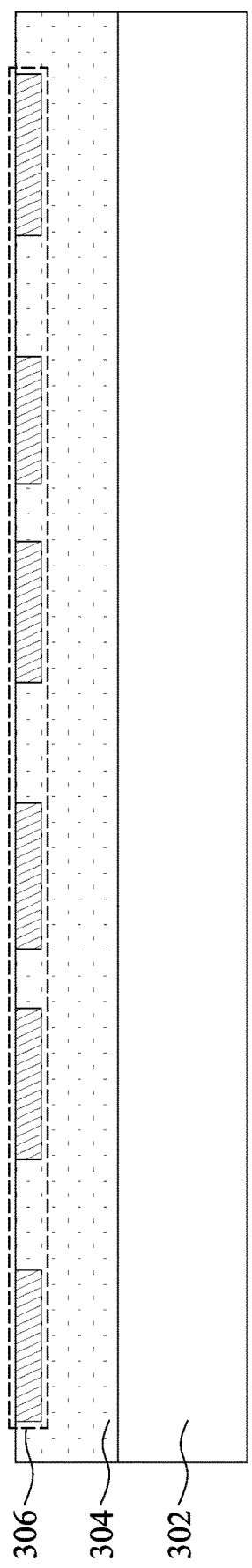

Referring to FIG. 3A, a substrate 302 is received or formed. The substrate 302 may be a semiconductor wafer such as a silicon wafer. Alternatively or additionally, the substrate 302 may include elementary semiconductor materials, compound semiconductor materials, or alloy semiconductor materials similar to those of the substrate 202. In some embodiments, the substrate 302 and the substrate 202 include different materials. The substrate 302 may also be a bulk semiconductor substrate or a semiconductor-on-insulator (SOI) substrate.

Still Referring to FIG. 3A, a dielectric layer 304 is formed over the substrate 302. The dielectric layer 304 may be an inter-layer dielectric (ILD) layer or an inter-metal dielectric (IMD) layer. The dielectric layer 304 may be blanket formed over the substrate 302. The dielectric layer 304 may be formed using a deposition technique, for example, CVD. The dielectric layer 304 may also be a spin-on glass formed using spin-on coating. The dielectric layer 304 may be formed of dielectric materials similar to those of the dielectric layer 204. In alternative embodiments, the dielectric layer 304 and the dielectric layer 204 include different materials.

Figure 3C:
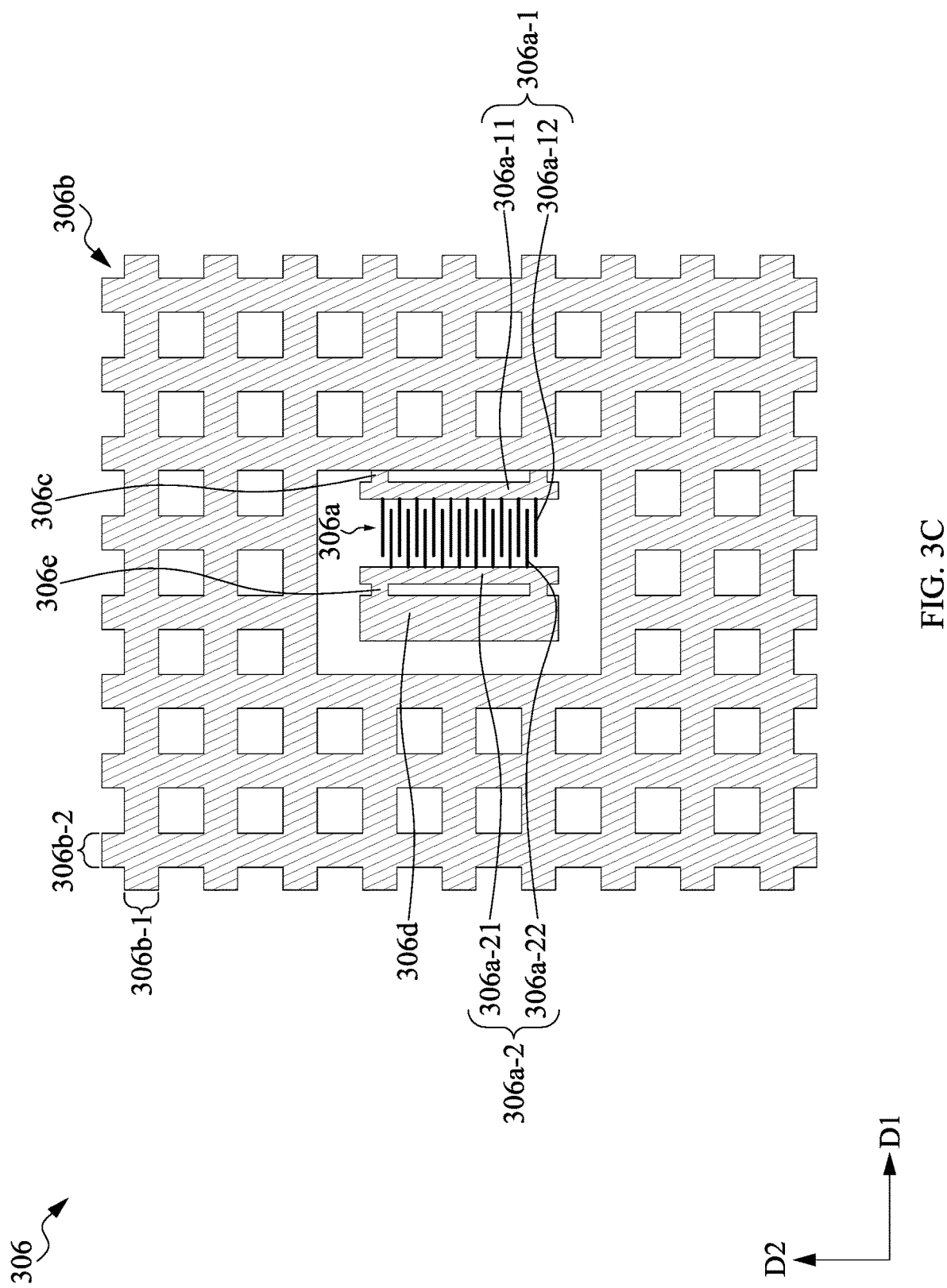
Figure 3D:
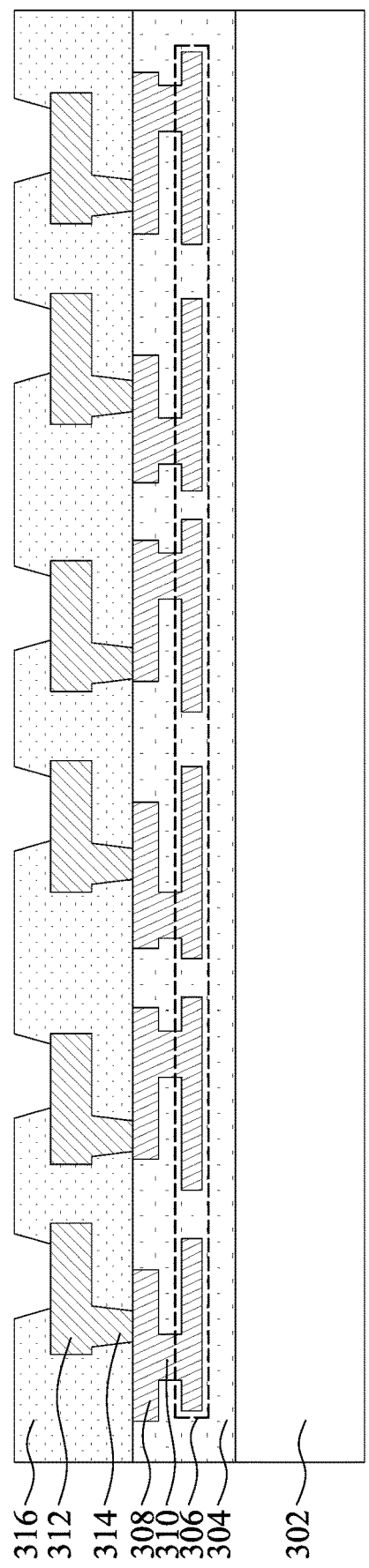

Referring to FIG. 3D, a charge measurement element 306 is formed over the substrate 302. In some embodiments, the charge measurement element 306 is formed in the dielectric layer 304. The formation of charge measurement element 306 may include patterning the dielectric layer 304 and depositing a seed layer (such as a titanium layer and an overlying copper layer, which are not shown) over dielectric layer 304. A patterned photo resist (not shown) is then formed over the seed layer, and a metallic material is plated in the pattern of the patterned photo resist. The photo resist is then removed, and the portions of the seed layer covered by the photo resist are removed. The remaining portions of the plated metallic material form the pattern of the charge measurement element 306. The charge measurement element 306 may be formed of conductive materials, such as copper, tungsten, aluminum or other suitable conductive materials. In some embodiments, the conductive layer in which the charge measurement element 306 resides is referred to herein as a top metal layer.

FIG. 3C illustrates a top view of the charge measurement element 306. Referring to FIG. 3C, the charge measurement element 306 may include a capacitor 306a and a conductive mesh 306b. The capacitor 306a includes a first electrode 306a-1 and a second electrode 306a-2. At least a portion of the dielectric layer 304 is between the first electrode 306a-1 and the second electrode 306a-2. The portion of the dielectric layer 304 between the first electrode 306a-1 and the second electrode 306a-2 may be regarded as the insulating layer of the capacitor 306a. Thus, the capacitor 306a is formed by the first electrode 306a-1, the second electrode 306a-2 and portions of the dielectric layer 304. The portions of the dielectric layer 304 between the first electrode 306a-1 and the second electrode 306a-2 may have a first breakdown voltage.

The first electrode 306a-1 may include a main segment 306a-11 and one or more branch segments 306a-12. The branch segments 306a-12 are connected to each other through the main segment 306a-11. In some embodiments, the branch segments 306a-12 are perpendicular to the main segment 306a-11. The second electrode 306a-2 may also include a main segment 306a-21 and one or more branch segments 306a-22. The branch segments 306a-22 are connected to each other through the main segment 306a-21. In some embodiments, the branch segments 306a-22 are perpendicular to the main segment 306a-21. In some embodiments, the branch segments 306a-12 extend to the second electrode 306a-2 and the branch segments 306a-22 extend to the first electrode 306a-1. The branch segments 306a-12 are alternatingly arranged with the branch segments 306a-22. The dielectric layer 304 may be interposed between the branch segments 306a-12 of the first electrode 306a-1 and the branch segments 306a-22 of the second electrode 306a-2.

As illustrated in FIG. 3C, the conductive mesh 306b may be arranged in a mesh layout. The conductive mesh 306b may include a plurality of first conductive segments 306b-1 extending in the first direction D1 and a plurality of second conductive segments 306b-2 extending in the second direction D2. The first conductive segments 306b-1 are arranged in parallel to each other. The second conductive segments 306b-2 are arranged in parallel to each other. In some embodiments, the first conductive segments 306b-1 are perpendicular to the second conductive segments 306b-2.

In some embodiments, the capacitor 306a is electrically connected to the conductive mesh 306b through one or more conductive vias 306c. The first electrode 306a-1 of the capacitor 306a may be electrically connected to the conductive mesh 306b through the conductive vias 306c. In some embodiments, the charge measurement element 306 further includes a conductive pad 306d. In some embodiments, the capacitor 306a is electrically connected to the conductive pad 306d through one or more conductive vias 306e. The conductive pad 306d may be configured as a connection contact for electrically connecting to overlying features. The conductive mesh 306b of the charge measurement element 306 is configured to receive and/or collect charges during the manufacturing operations for forming the redistribution structure of the InFO package. Furthermore, the capacitor 306a of the charge measurement element 306 may be used as an indicator of charge-induced voltages arising during the manufacturing operations for forming the redistribution structure of the InFO package.

Referring to FIG. 3D, a plurality of conductive pads 308 and a plurality of conductive vias 310 are formed over the substrate 302. In some embodiments, the conductive pads 308 and the conductive vias 310 are formed over the charge measurement element 306. In some embodiments, the conductive pads 308 and the conductive vias 310 are formed in the dielectric layer 304. The conductive pads 308 may be electrically connected to the charge measurement element 306 through the conductive vias 310. In some embodiments, at least one conductive pad 308 is electrically connected to the first electrode 306a-1 of the capacitor 306a, and at least another conductive pad 308 is electrically connected to the second electrode 306a-2 of the capacitor 306a. In some embodiments, the at least one conductive pad 308 is electrically connected to the first electrode 306a-1 through the conductive via 310, the conductive mesh 306b and the conductive via 306c. In some embodiments, the at least another conductive pad 308 is electrically connected to the second electrode 306a-2 through the conductive via 310, the conductive pad 306d and the conductive via 306e.

Still referring to FIG. 3D, a plurality of conductive pads 312, a plurality of conductive vias 314 and a passivation layer 316 are formed over the substrate 302. In some embodiments, the conductive pads 312, the conductive vias 314 and the passivation layer 316 are formed over the charge measurement element 306 and the dielectric layer 304. In some embodiments, a first portion of the passivation layer 316 is formed over the dielectric layer 304 and has openings that partially expose the conductive pads 312 on the dielectric layer 304. The conductive pads 312 may be aluminum pads, copper pads or other suitable metal pads. The passivation layer 316 may be a silicon oxide layer, a silicon nitride layer, a silicon oxy-nitride layer or a dielectric layer formed of any suitable dielectric materials. In some embodiments, the conductive vias 314 are formed by suitable techniques such as plating, CVD, ALD or the like. As illustrated in FIG. 3D, each of the conductive vias 314 is respectively disposed on the corresponding conductive pad 308. The conductive pads 312 are disposed on the conductive vias 314. The conductive pads 312 are electrically connected to the charge measurement element 306 through the conductive vias 314 and the conductive pads 308. In some embodiments, a second portion of the passivation layer 316 is then formed and patterned on the first portion of the passivation layer 316 and exposes portions of the conductive pads 312.

Figure 3E:
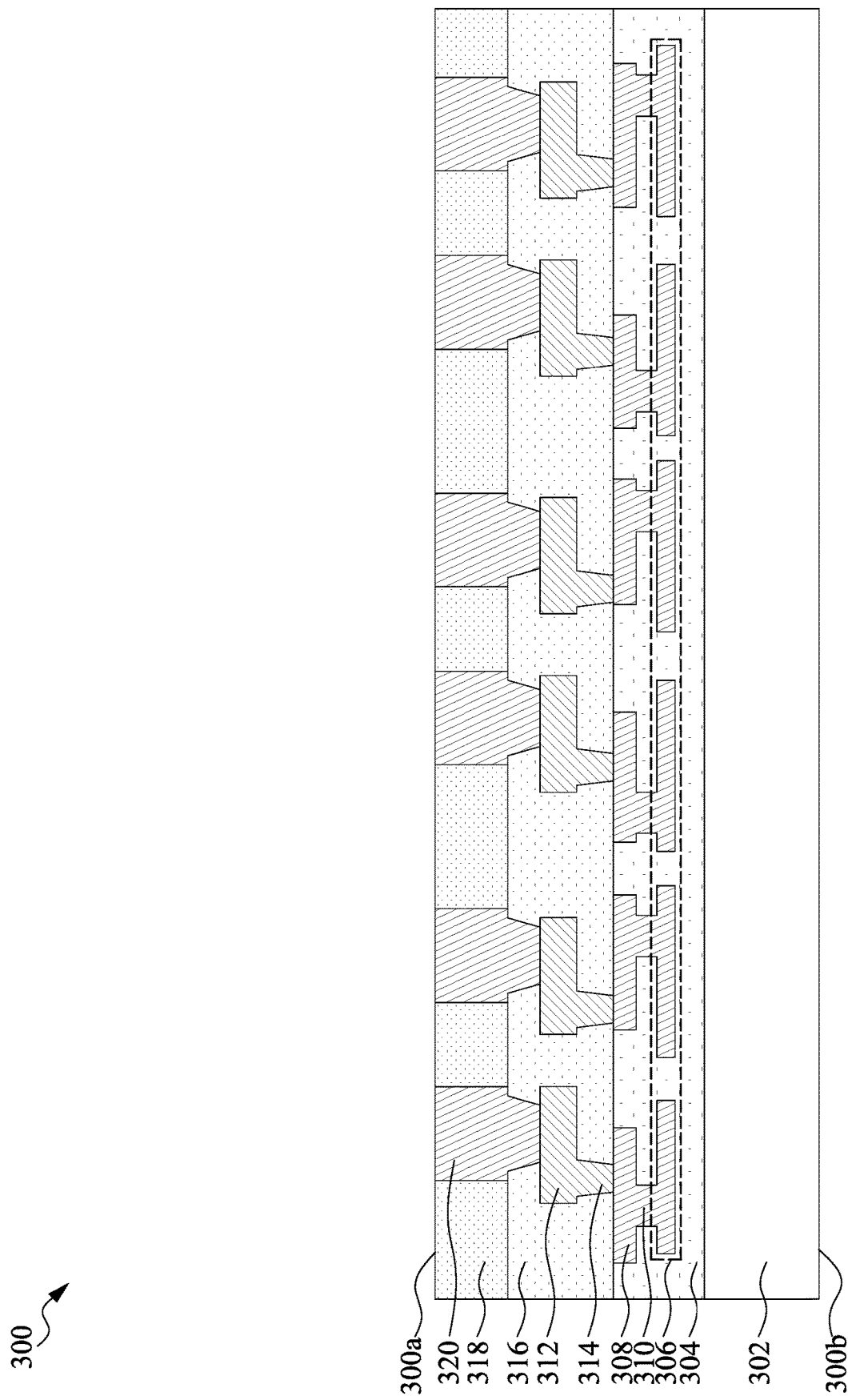

Referring to FIG. 3E, in some embodiments, a post passivation layer 318 is formed over the passivation layer 316. The post passivation layer 318 may cover the passivation layer 316 and may be patterned to include a plurality of contact openings. The conductive pads 312 are partially exposed by the contact openings of the post passivation layer 318. The post passivation layer 318 may be a benzocyclobutene (BCB) layer, a polyimide (PI) layer, a polybenzoxazole (PBO) layer, or a dielectric layer formed of other suitable polymers. In some embodiments, conductive posts (or conductive vias) 320 are formed on the conductive pads 312 by plating. In some embodiments, the post passivation layer 318 covers the top surfaces of the conductive posts 320 so as to protect the conductive posts 320. In alternative embodiments, a protection layer (not shown) is formed on the post passivation layer 318, covering the top surfaces of the conductive posts 320 so as to protect the conductive posts 320. In some embodiments, the post passivation layer 318 and the conductive posts 320 are ground or polished by a planarization step. For example, the planarization step is performed through a mechanical grinding process and/or a CMP process until the top surfaces of the conductive posts 320 are revealed.

Based on the operations with reference to FIGS. 3A to 3E, a charge measurement unit 300 is thus formed. The charge measurement unit 300 includes the substrate 302, the dielectric layer 304, the charge measurement element 306, the conductive pads 308, the conductive vias 310, the conductive pads 312, the conductive vias 314, the passivation layer 316, the post passivation layer 318 and the conductive posts 320. The charge measurement unit 300 has a front surface 300a and a back surface 300b opposite to the front surface 300a. The charge measurement element 306 is configured to receive and/or collect charges during the manufacturing operations for forming the redistribution structure of the InFO package. Furthermore, the charge measurement element 306 may be used as an indicator of charge-induced voltages arising during the manufacturing operations for the redistribution structure of forming the InFO package, as will be illustrated and discussed later with reference to FIGS. 5A-5I.

The structures of the charge receiving unit 200 and the charge measurement unit 300 set forth in the present disclosure are not limited to the above-mentioned embodiments and may have other different embodiments. Operations similar to those illustrated in FIGS. 3A-3E may be repeated for forming another charge measurement unit, such as a charge measurement unit 400 illustrated in FIG. 4A. To simplify the description and for the convenience of comparison between each of the embodiments of the present disclosure, the similar components in each of the following embodiments are marked with similar numerals. For making it easier to compare the difference between the embodiments, the following description will detail the dissimilarities among different embodiments and the identical features will not be repeated.

Figure 4A:
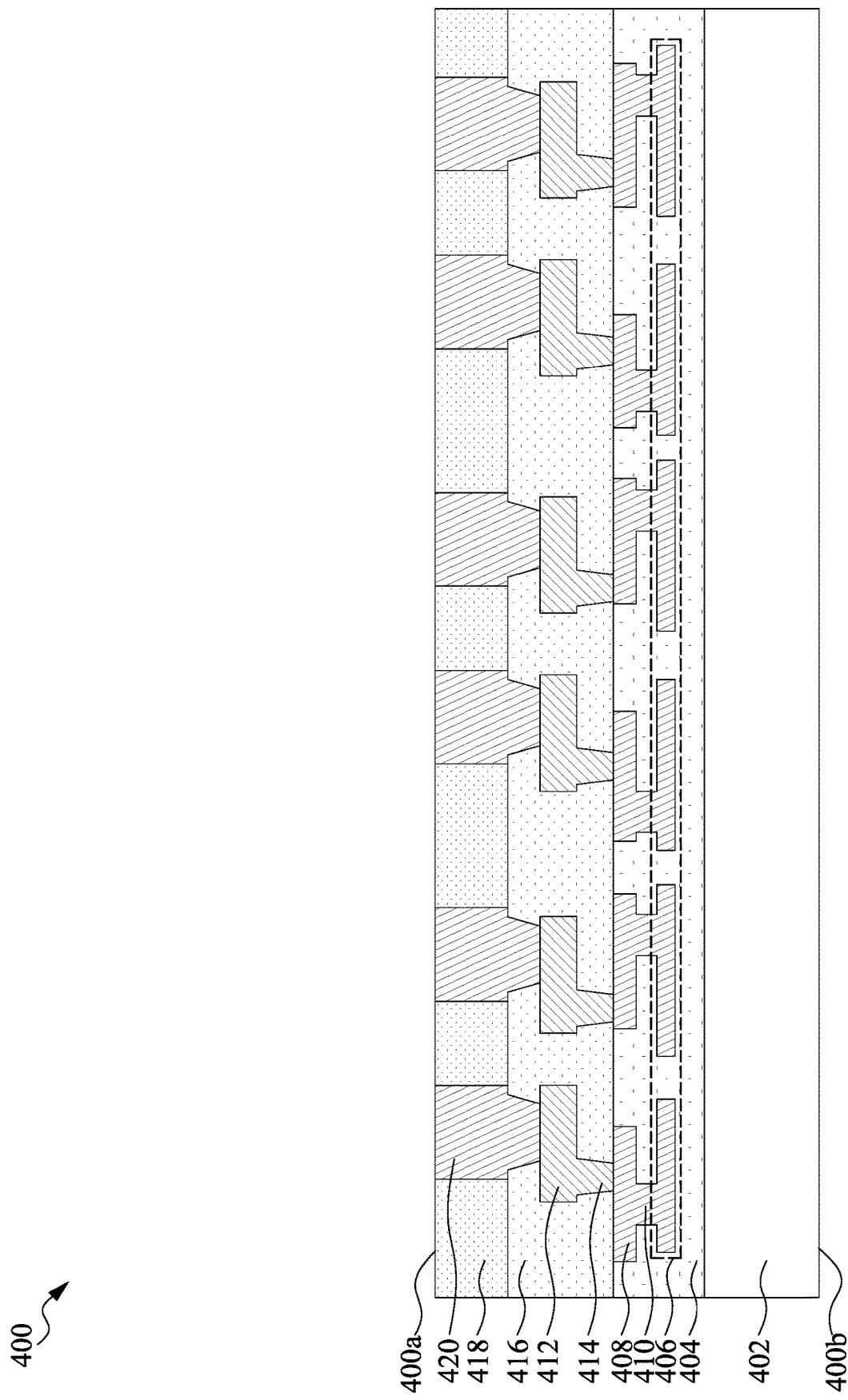
FIG. 4A illustrates a cross-sectional view of a charge measurement unit according to aspects of one or more embodiments of the present disclosure.
Figure 4B:
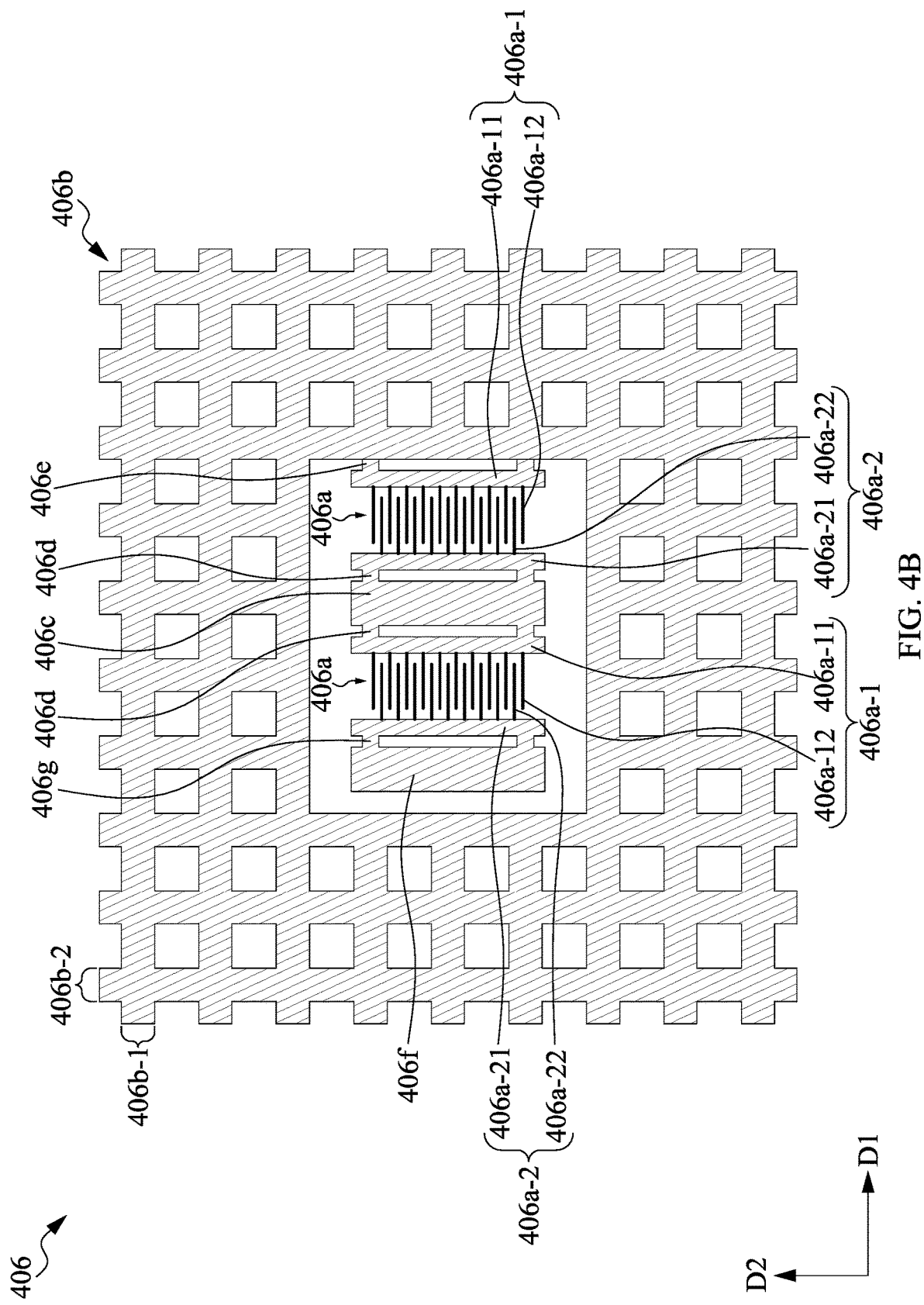
FIG. 4B illustrates a top view of a charge measurement element.

FIG. 4A illustrates a cross-sectional view of a charge measurement unit 400 according to aspects of one or more embodiments of the present disclosure, and FIG. 4B illustrates a top view of a charge measurement element 406. Referring to FIG. 4A, the charge measurement unit 400 includes the substrate 402, the dielectric layer 404, the charge measurement element 406, the conductive pads 408, the conductive vias 410, the conductive pads 412, the conductive vias 414, the passivation layer 416, the post passivation layer 418 and the conductive posts 420. The charge measurement unit 400 has a front surface 400a and a back surface 400b opposite to the front surface 400a.

Referring to FIG. 4B, the charge measurement element 406 may include one or more capacitors 406a and a conductive mesh 406b. Each of the capacitors 406a includes a first electrode 406a-1 and a second electrode 406a-2. At least a portion of the dielectric layer 404 is between the first electrode 406a-1 and the second electrode 406a-2. The portion of the dielectric layer 404 between the first electrode 406a-1 and the second electrode 406a-2 may be regarded as the insulating layer of the capacitor 406a. Thus, the capacitor 406a is formed by the first electrode 406a-1, the second electrode 406a-2 and portions of the dielectric layer 404. The portions of the dielectric layer 404 between the first electrode 406a-l and the second electrode 406a-2 may have a second breakdown voltage. In some embodiment, the second breakdown voltage of the dielectric layer 404 is identical to the first breakdown voltage of the dielectric layer 304. In alternative embodiments, the dielectric layer 404 includes materials different from the dielectric layer 304. In such embodiments, the second breakdown voltage is different from the first breakdown voltage.

The first electrode 406a-1 may include a main segment 406a-11 and one or more branch segments 406a-12. The branch segments 406a-12 are connected to each other through the main segment 406a-11. In some embodiments, the branch segments 406a-12 are perpendicular to the main segment 406a-11. The second electrode 406a-2 may also include a main segment 406a-21 and one or more branch segments 406a-22. The branch segments 406a-22 are connected to each other through the main segment 406a-21. In some embodiments, the branch segments 406a-22 are perpendicular to the main segment 406a-21. In some embodiments, the branch segments 406a-12 extend to the second electrode 406a-2 and the branch segments 406a-22 extend to the first electrode 406a-1. The branch segments 406a-12 are alternatingly arranged with the branch segments 406a-22. The dielectric layer 404 may be interposed between the branch segments 406a-12 of the first electrode 406a-1 and the branch segments 406a-22 of the second electrode 406a-2.

As illustrated in FIG. 4B, the charge measurement element 406 includes two capacitors 406a connected in series. For example, the first electrode 406a-1 of one capacitor 406a is electrically connected the second electrode 406a-2 of the other one capacitor 406a. In some embodiments, the two capacitors 406a are connected in series through a conductive pad 406c and one or more conductive vias 406d.

The conductive mesh 406b may be arranged in a mesh layout. The conductive mesh 406b may include a plurality of first conductive segments 406b-1 extending in the first direction D1 and a plurality of second conductive segments 406b-2 extending in the second direction D2. The first conductive segments 406b-1 are arranged in parallel to each other. The second conductive segments 406b-2 are arranged in parallel to each other. In some embodiments, the first conductive segments 406b-1 are perpendicular to the second conductive segments 306b-2.

In some embodiments, one of the capacitors 406a is electrically connected to the conductive mesh 406b through one or more conductive vias 406e. The first electrode 406a-1 of the capacitor 406a may be electrically connected to the conductive mesh 406b through the conductive vias 406e. In some embodiments, the charge measurement element 406 further includes a conductive pad 406f. In some embodiments, another one of the capacitors 406a is electrically connected to the conductive pad 406f through one or more conductive vias 406g. The conductive pad 406f may be configured as a connection contact for electrically connecting to overlying features.

Referring to FIGS. 4A and 4B, the conductive pads 408 may be electrically connected to the charge measurement element 406 through the conductive vias 410. In some embodiments, at least one conductive pad 408 is electrically connected to the first electrode 406a-1 of the capacitor 406a, and at least another conductive pad 408 is electrically connected to the second electrode 406a-2 of the capacitor 406a. In some embodiments, the at least one conductive pad 408 is electrically connected to the first electrode 406a-1 through the conductive via 410, the conductive mesh 406b and the conductive via 406e. In some embodiments, the at least another conductive pad 408 is electrically connected to the second electrode 406a-2 through the conductive via 410, the conductive pad 406f and the conductive via 406g.

The conductive mesh 406b of charge measurement element 406 may be configured to receive and/or collect charges during the manufacturing operations for forming the redistribution structure of the InFO package. Furthermore, the capacitors 406a of the charge measurement element 406 may be used as an indicator of charge-induced voltages arising during the manufacturing operations for forming the redistribution structure of the InFO package, as will be illustrated and discussed later with reference to FIGS. 5A-5I. Since the charge measurement element 406 includes capacitors 406a connected in series, the overall breakdown voltage of the charge measurement element 406 may be twice the breakdown voltage of the charge measurement element 306.

FIGS. 5A through 5I are schematic drawings of cross-sectional views of a semiconductor package at different stages of a fabrication and testing method associated with the semiconductor package according to aspects of one or more embodiments of the present disclosure.

Figure 5A:
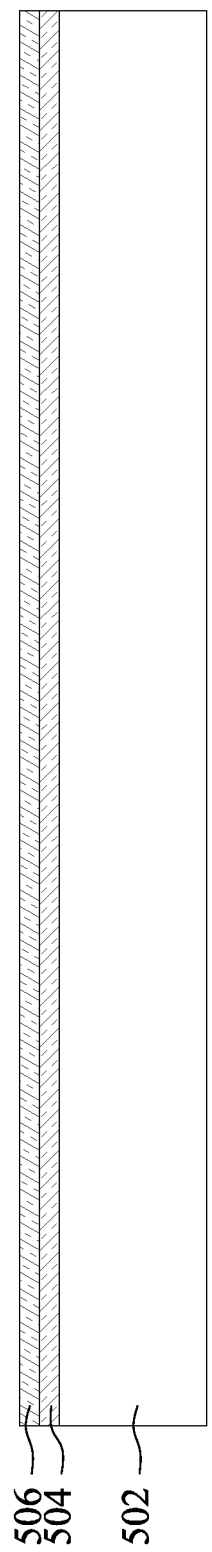
FIGS. 5A through 5I are schematic drawings of cross-sectional views of a semiconductor package at different stages of a fabrication and testing method associated with the semiconductor package according to aspects of one or more embodiments of the present disclosure.

Referring to FIG. 5A, a carrier substrate 502 is provided. The respective step is shown as operation 102 of the method 100 shown in FIG. 1. In some embodiments, the carrier substrate 502 may be a glass carrier or any suitable carrier for carrying a semiconductor wafer used for the manufacturing method of the semiconductor package structure, such as an InFO package structure. In some embodiments, a release layer 504 is coated on the carrier substrate 502. In some embodiments, the release layer 504 may be any material suitable for bonding and de-bonding the carrier substrate 502 from the above layer(s) or any die(s) disposed thereon. Alternatively or additionally, an adhesive layer 506 is provided on the carrier substrate 502. In some embodiments, the adhesive layer 506 is used for attaching die(s) to the carrier substrate 502. In some embodiments, the adhesive layer 506 may be formed of, for example, an Ultra-Violet (UV) glue.

Figure 5B:
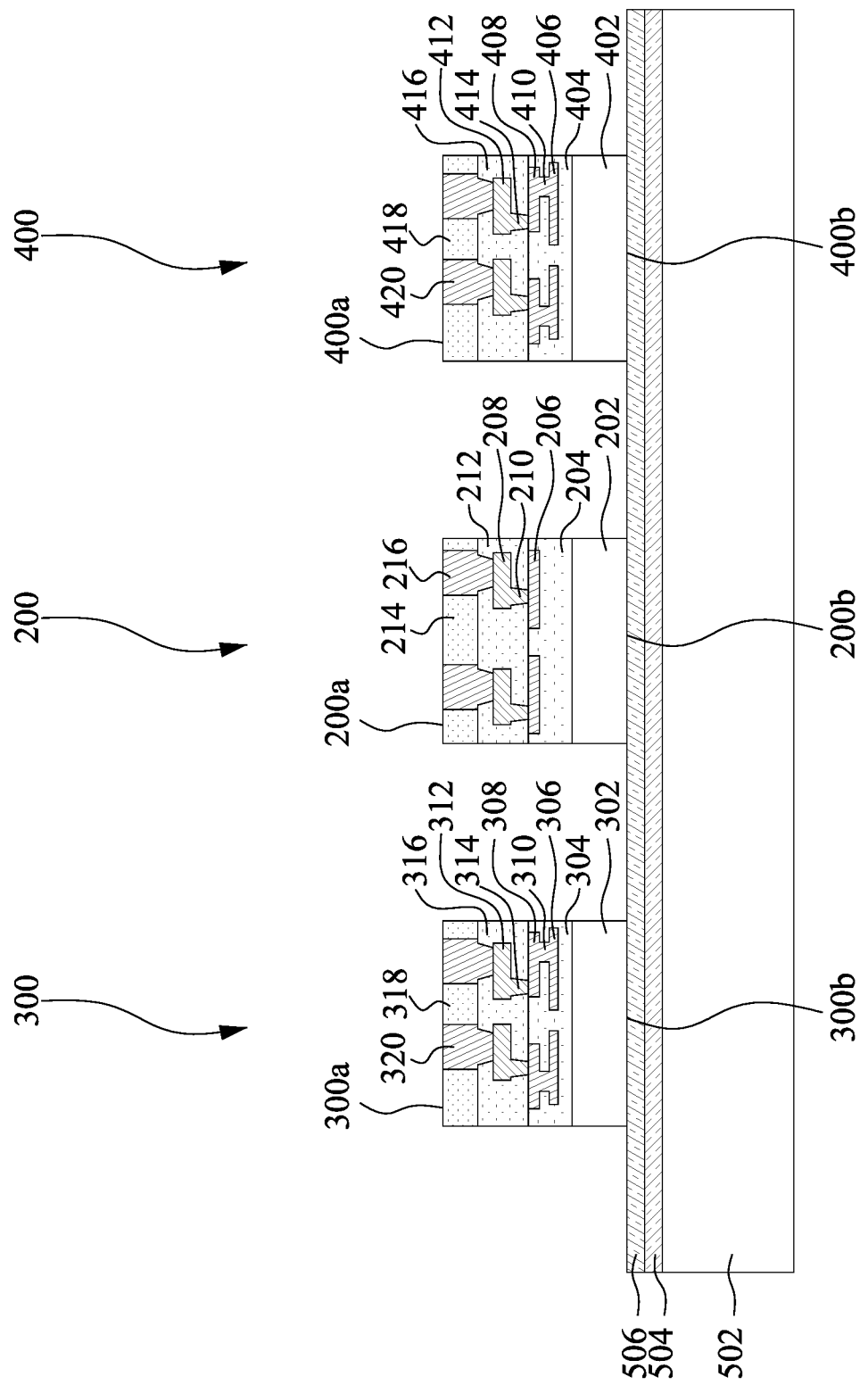

Referring to FIG. 5B, at least one charge receiving unit 200 and one or more charge measurement units (e.g., the charge measurement unit 300 and/or the charge measurement unit 400) are disposed over the carrier substrate 502. The respective step is shown as operation 104 of the method 100 shown in FIG. 1. The charge measurement unit 300 and the charge measurement unit 400 may be arranged adjacent to the charge receiving unit 200. The charge measurement unit 300 and the charge measurement unit 400 may be disposed in the same level as the charge receiving unit 200. The charge receiving unit 200 and the charge measurement units 300 and 400 are placed with their back surfaces 200b, 300b and 400b facing the carrier substrate 502. The front surfaces 300a and 400a of the charge measurement units 300 and 400 may be level with each other. Furthermore, the front surface 200a of the charge receiving unit 200 and the front surface 300a or 400a of the charge measurement unit 300 or 400 may be level with each other. In some exemplary embodiments, the charge measurement units 300 and 400 are designed with different breakdown voltage indicators. For example, the charge measurement element 406 includes two capacitors 406a connected in series, while the charge measurement element 306 includes one capacitor 306a, and thus the overall breakdown voltage of the charge measurement element 406 may be twice the breakdown voltage of the charge measurement element 306. Therefore, the charge measurement units 300 and 400 provide two different indicators for an ESD testing operation. Although two charge measurement units 300 and 400 are illustrated, more charge measurement units designed for different target breakdown voltage settings may be placed over the carrier substrate 502 and level with each other, thereby providing multiple target breakdown voltage indicators for an EST testing operation.

Figure 5C:
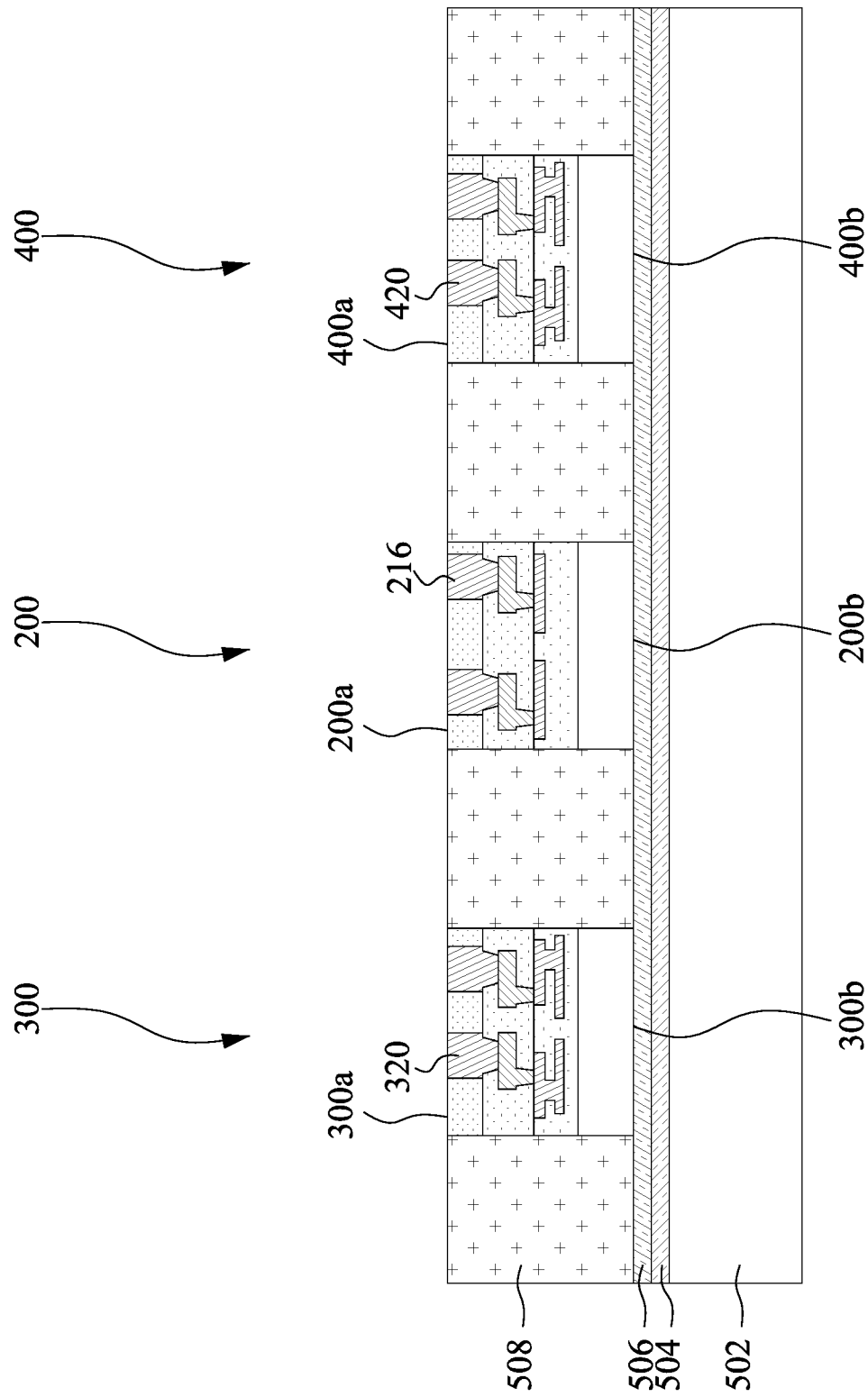

Referring to FIG. 5C, a molding material 508 is formed over the charge receiving unit 200 and the charge measurement units 300 and 400. In some embodiments, the molding material 508 is formed through, for example, a compression molding process, filling up the gaps between the charge receiving unit 200 and the charge measurement unit 300 or 400 to encapsulate the charge receiving unit 200 and the charge measurement units 300 and 400. In some embodiments, the molding material 508 includes polymers (such as epoxy resins, phenolic resins, silicon-containing resins, or other suitable resins) or other suitable materials. In some embodiments, the molding material 508 is ground or polished by a planarization step. For example, the planarization step is performed through a mechanical grinding process and/or a CMP process until the front surfaces 200a, 300a and 400a (or active surfaces) of the charge receiving unit 200 and the charge measurement units 300 and 400 are revealed. In some embodiments, the conductive posts 216, 320, 420 may be partially polished so that the front surfaces 200a, 300a and 400a of the conductive posts 216, 320, 420 are level with the top surface of the molding material 508.

Figure 5D:
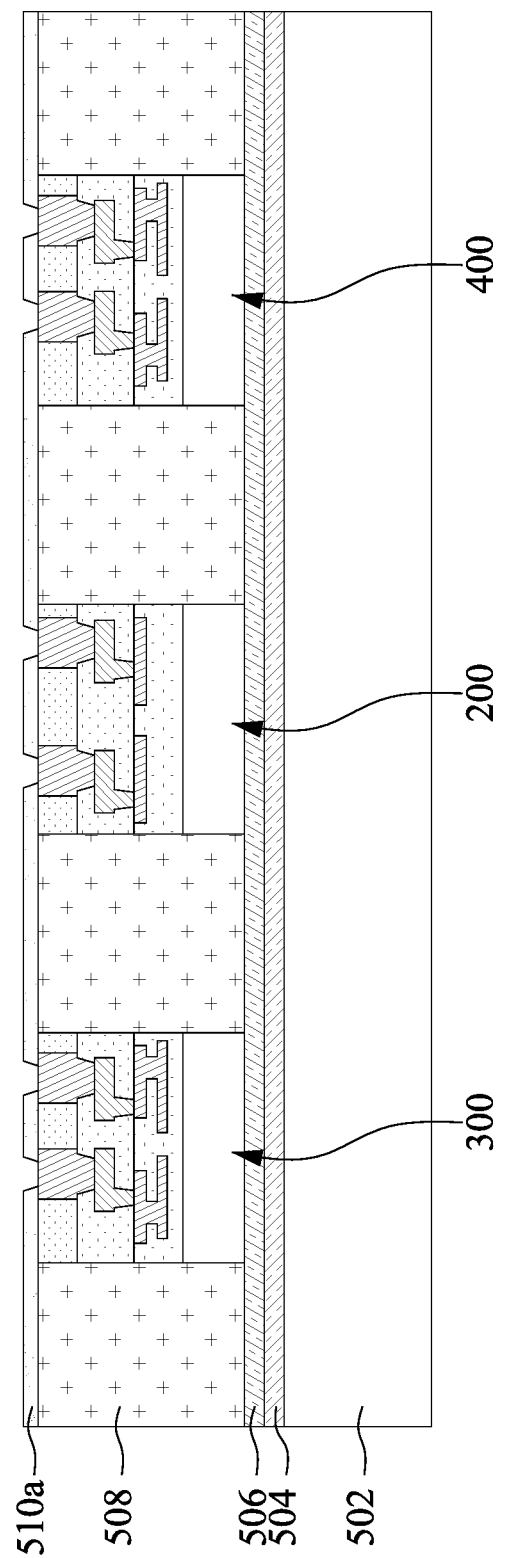

Referring to FIG. 5D, a dielectric layer 510a is formed over the charge receiving unit 200 and the charge measurement units 300 and 400. The respective step is shown as operation 106 of the method 100 shown in FIG. 1. In some embodiments, the dielectric layer 510a is formed on the molding material 508, the charge receiving unit 200 and the charge measurement units 300 and 400. As illustrated in FIG. 5D, the dielectric layer 510a is formed on the front surface 200a of the charge receiving unit 200, on the front surfaces 300a and 400a of the charge measurement units 300 and 400, and on the top surface of the molding material 508. The dielectric layer 510a may be patterned using a photolithography and/or etching process and has openings that partially expose the conductive posts 216, 320 and 420. In some embodiments, the material of the dielectric layer 210a may be polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like. In some embodiments, the dielectric layer 510a is formed by suitable fabrication techniques such as spin-on coating, CVD, plasma-enhanced chemical vapor deposition (PECVD). The disclosure is not limited thereto.

Figure 5E:
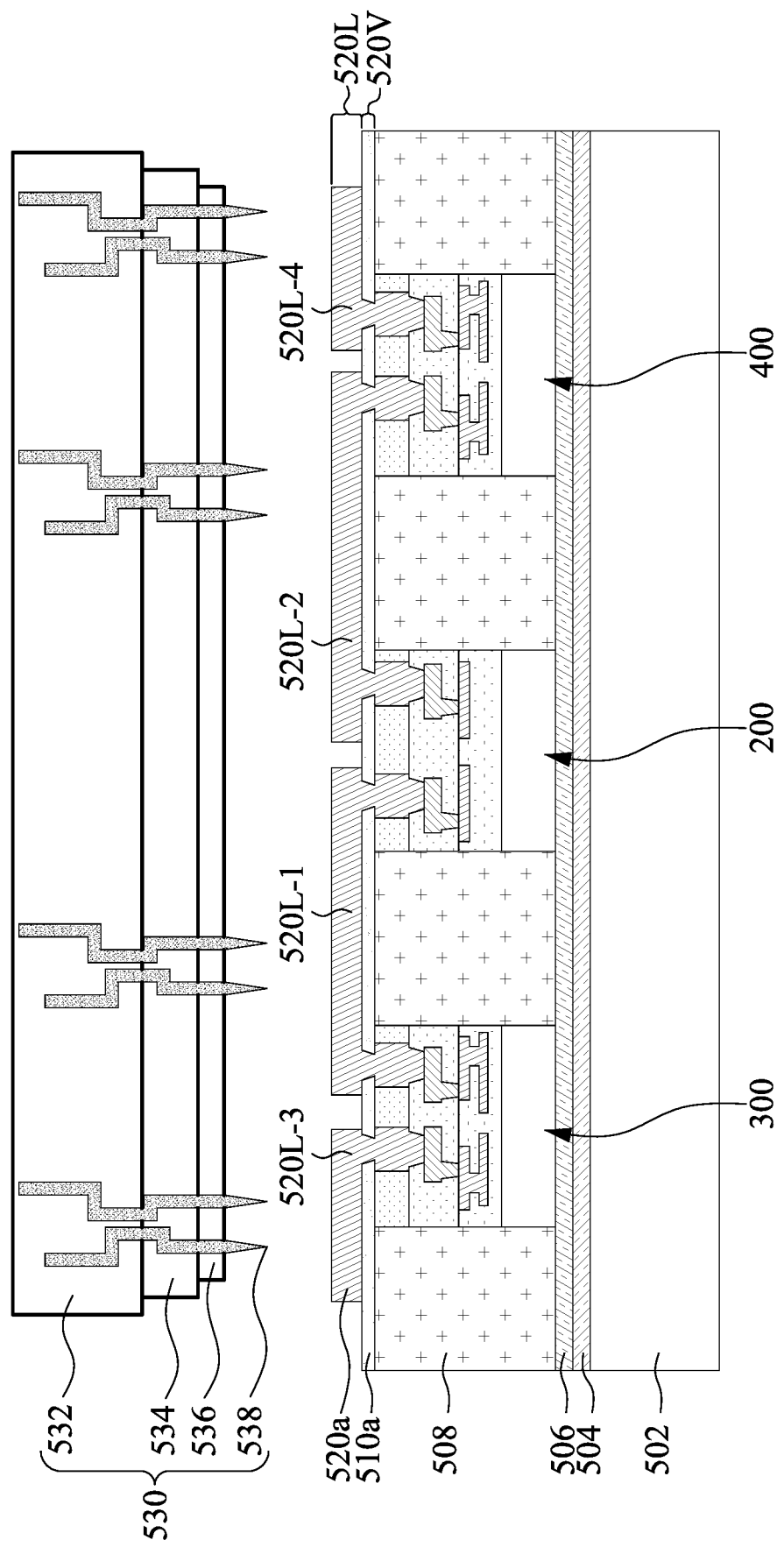

Referring to FIG. 5E, a metallization layer 520a is formed over the dielectric layer 510a. The respective step is shown as operation 108 of the method 100 shown in FIG. 1. The formation of the metallization layer 520a may include depositing a seed layer (such as a titanium layer and an overlying copper layer, which are not shown) over the dielectric layer 510a. In some embodiments, the forming of the seed layer creates a conductive path for the induced charges previously accumulated on the charge receiving unit 200, the charge measurement unit 300 and/or the charge measurement unit 400. Thus, the previously induced charges can be easily drained. A patterned photo resist (not shown) is then formed over the seed layer, and a metallic material is plated in the patterned photo resist. The photo resist is then removed, and the portions of the seed layer covered by the photo resist are removed. The remaining portions of the plated metallic material form the metallization layer 520a. In some embodiments, the metallization layer 520a includes conductive vias 520V filling the openings of the dielectric layer 510a and conductive pads 520L, or conductive lines, as will be later used in present disclosure, over the dielectric layer 510a.

In some embodiments, the material of the metallization layer 520a may be made of conductive materials formed by electroplating or deposition, such as aluminum, titanium, copper, nickel, tungsten, and/or alloys thereof, which may be patterned using a photolithography and etching process. In some embodiments, the metallization layer 520a may be patterned copper layers or other suitable patterned metal layers. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

In some embodiments, the metallization layer 520a is electrically connected to the conductive posts 216 of the charge receiving unit 200, and hence the metallization layer 520a is electrically connected to the charge receiving element 206. Furthermore, the metallization layer 520a is electrically connected to the conductive posts 320 of the charge measurement unit 300, and hence the metallization layer 520a is electrically connected to the charge measurement element 306. In some embodiments, the metallization layer 520a is electrically connected to the conductive posts 420 of the charge measurement unit 400, and hence the metallization layer 520a is electrically connected to the charge measurement element 406. In some embodiments, the metallization layer 520a includes a conductive pad 520L-1 electrically connected to the charge receiving unit 200 and the charge measurement unit 300. Furthermore, the metallization layer 520a includes a conductive pad 520L-2 electrically connected to the charge receiving unit 200 and the charge measurement unit 400. The conductive pads 520L-1 and 520L-2 may be configured as sacrificial pads or test pads in an ESD testing operation.

Referring to FIGS. 5D and 5E, in some embodiments, the various processes involved in manufacturing the metallization layer 520a include, but not limited to, grinding, etching, various deposition techniques, and the like. The forming of the metallization layer 520a may involve plasma-enhanced operations and may thus induce charges. As discussed previously, the charge receiving element 206 of the charge receiving unit 200, the charge measurement element 306 of the charge measurement unit 300 and the charge measurement element 406 of the charge measurement unit 400 may be used for receiving and/or collecting charges during the manufacturing operations for forming the metallization layer 520a. Furthermore, the charge measurement element 306 of the charge measurement unit 300 and the charge measurement element 406 of the charge measurement unit 400 may be used as an indicator of charge-induced voltages arising during the manufacturing operations for forming the metallization layer 520a. Hence, the induced charges may accumulate on the charge receiving unit 200 and/or the charge measurement units 300 and 400.

In some embodiments, the induced charges are mainly collected or received by the charge receiving element 206 of the charge receiving unit 200. Furthermore, a small amount of the induced charges is collected or received by the conductive mesh 306b of the charge measurement element 306 of the charge measurement unit 300 and/or the conductive mesh 406b of the charge measurement element 406 of the charge measurement unit 400. The induced charges collected by the charge receiving unit 200 may flow to the charge measurement unit 300 through the conductive pad 520L-1. Hence, the first electrode 306a-1 (FIG. 3C) of the charge measurement unit 300 may receive the charges from the charge receiving unit 200 and/or the conductive mesh 306b. The induced charges collected by the charge receiving unit 200 may also flow to the charge measurement unit 400 through the conductive pad 520L-2. Hence, the first electrode 406a-1 (FIG. 4B) of the charge measurement unit 400 may receive the charges from the charge receiving unit 200 and/or the conductive mesh 406b.

The conductive pads 520L-1, 520L-2, 520L-3 and 520L-4 of the metallization layer 520a may be used as points of contact for the probes of a probe card 530. In some embodiments, to ensure that the probes actually contacts the conductive pads 520L-1 through 520L-4, a diameter of the conductive pad 520L-1, 520L-2, 520L-3 or 520L-4 is greater than about 60 μm. The probe card 530 may serve as an interface between an electric test system and a semiconductor package. The probe card 530 is used to provide a conduction path between a respective testing system and the semiconductor package. In some embodiments, the probe card 530 includes a probe card printed circuit board (PCB) 532, a probe card substrate 534, a probe card head 536 and probe needles (test probes) 538. Of course, other probe cards 530 can be used in embodiments of the present disclosure.

With continued reference to FIG. 5E, a first test is performed against the charge measurement unit 300 through the conductive pads 520L-1and 520L-3 to determine whether breakdown occurs in the charge measurement unit 300. The respective step is shown as operation 110 of the method 100 shown in FIG. 1. In some embodiments, to ensure probing stability, each of the conductive pads 520L-1 and 520L-3 is in contact with two test probes 538 during the first test. The conductive pads 520L-1 and 520L-3 are respectively configured as input and output terminals during the first test. A signal (e.g., a voltage or a current) may be transmitted through the test probes 538 to the conductive pad 520L-1, and the first electrode 306a-1 (FIG. 3C) of the charge measurement unit 300 may receive the transmitted signal. If the test probes 538 contacting the conductive pad 520L-3 does not receive the transmitted signal, it can be determined that no breakdown occurs in the charge measurement unit 300. A breakdown may occur when a field strength of the induced charges accumulated on the first electrode 306a-1 becomes large enough to pull electrons in the dielectric layer 304 from their atoms, thereby causing conduction. In alternative embodiments, if the test probes 538 contacting the conductive pad 520L-3 receive the transmitted signal, it can be determined that breakdown occurs in the charge measurement unit 300. If a test result (regarding whether breakdown occurs) shows that breakdown occurs in the charge measurement unit 300, it can be determined that the operations for forming the metallization layer 520a creates a voltage greater than the breakdown voltage of the charge measurement unit 300.

If a test result of the first test shows that breakdown occurs in the charge measurement unit 300, a second test is performed against the charge measurement unit 400 through the conductive pads 520L-2 and 520L-4 to determine whether breakdown occurs in the charge measurement unit 400. The respective step is shown as operation 112 of the method 100 shown in FIG. 1. In some embodiments, to ensure probing stability, each of the conductive pads 520L-2 and 520L-4 is in contact with two test probes 538 during the second test. The conductive pads 520L-2 and 520L-4 are respectively configured as input and output terminals during the second test. In alternative embodiments, the first test and the second test are performed simultaneously.

A signal may be transmitted through the test probes 538 to the conductive pad 520L-2, and the first electrode 406a-1 (FIG. 4B) of the charge measurement unit 400 may receive the transmitted signal. If the test probes 538 contacting the conductive pad 520L-4 does not receive the signal, it can be determined that no breakdown occurs in the charge measurement unit 400. A breakdown may occur when a field strength of the induced charges accumulated on the first electrode 406a-1 becomes large enough to pull electrons in the dielectric layer 404 from their atoms, thereby causing conduction. In alternative embodiments, if the test probes 538 contacting the conductive pad 520L-4 receive the transmitted signal, it can be determined that breakdown occurs in the charge measurement unit 400. Since the charge measurement units 300 and 400 are designed with different breakdown voltage settings, and the overall breakdown voltage of the charge measurement element 406 is greater than the breakdown voltage of the charge measurement element 306, a breakdown may occur in the charge measurement unit 300 prior to the charge measurement unit 400.

If a test result of the second test shows that no breakdown occurs in the charge measurement unit 400 and the test result of the first test shows that breakdown occurs in the charge measurement unit 300, it can be determined that the operations for forming the metallization layer 520a creates a voltage greater than the breakdown voltage of the charge measurement unit 300 and less than the breakdown voltage of the charge measurement unit 400. In some embodiments, since the charges accumulated on the charge receiving unit 200, the charge measurement unit 300 and/or the charge measurement unit 400 are drained prior to the forming of the metallization layer 520a, the test results of the first test and the second test show whether breakdown occurs due to the accumulated charges induced by the forming of the metallization layer 520a only. Hence, a semiconductor package manufactured by similar operations may induce a similar voltage in response to an electrostatic discharge (ESD) event. The test result provides a clue for determining the specification of an ESD protection circuit in a semiconductor package for shunting the induced charges on the semiconductor package to thereby avoid ESD damage.

Figure 5F:
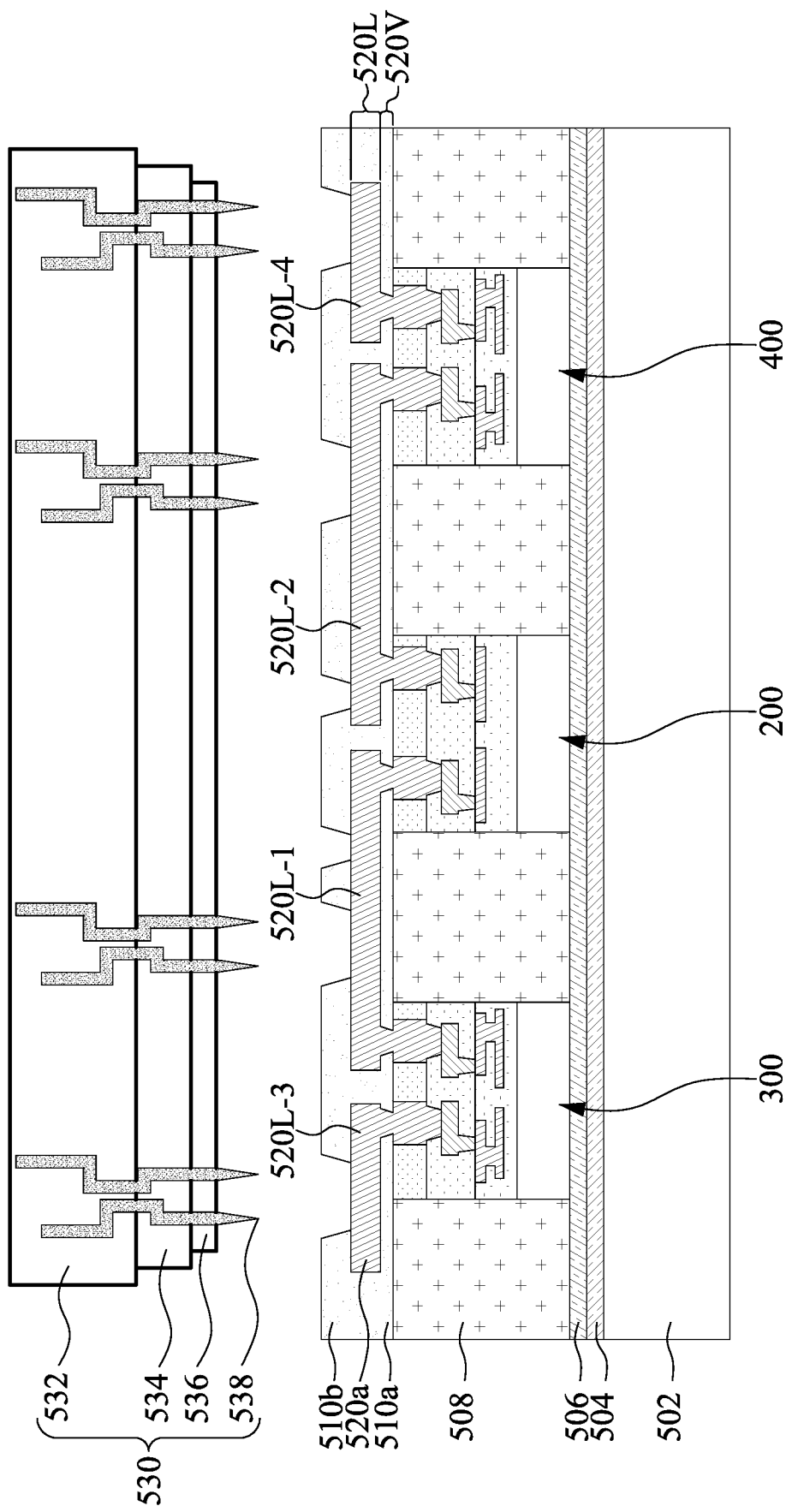

Referring to FIG. 5F, if at least one of the test result of the first test or the second test shows that no breakdown occurs, a dielectric layer 510b is formed over the metallization layer 520a. In some embodiments, a portion of the conductive pad 520L-1, 520L-2, 520L-3 or 520L-4 is exposed from the dielectric layer 510b. The respective step is shown as operations 114 and 116 of the method 100 shown in FIG. 1. The dielectric layer 510b may be patterned using a photolithography and/or etching process and has openings that partially expose the conductive pad 520L-1, 520L-2, 520L-3 and 520L-4. In some embodiments, the material of the dielectric layer 510b and the forming method are substantially same as those of the dielectric layer 510a. The forming of the dielectric layer 510b may induce charges. As discussed previously, the induced charges may accumulate on the charge receiving unit 200 and/or the charge measurement units 300 and 400.

If a test result of the first test shows that no breakdown occurs in the charge measurement unit 300, a third test is performed against the charge measurement unit 300 through the conductive pads 520L-1 and 520L-3 to determine whether breakdown occurs in the charge measurement unit 300. In some embodiments, to ensure that the probes actually contacts the conductive pads 520L-1 through 520L-4, each of the openings exposing the conductive pads 520L-1, 520L-2, 520L-3 and 520L-4 has diameter greater than about 60 μm. Furthermore, each of the conductive pads 520L-1, 520L-2, 520L-3 and 520L-4 is in contact with two test probes 538 during the tests. Similarly, the conductive pads 520L-1 and the 520L-3 are respectively configured as input and output terminals during the third test. If a test result of the third test shows that breakdown occurs in the charge measurement unit 300, it can be determined that the operations for forming the dielectric layer 510b creates a voltage greater than the breakdown voltage of the charge measurement unit 300.

Similarly, if the test result of the third test shows that breakdown occurs in the charge measurement unit 300, a fourth test is performed against the charge measurement unit 400 through the conductive pads 520L-2 and 520L-4 to determine whether breakdown occurs in the charge measurement unit 400. The conductive pads 520L-2 and 520L-4 are respectively configured as input and output terminals during the fourth test. In alternative embodiments, the third test and the fourth test are performed simultaneously. If a test result of the fourth test shows that no breakdown occurs in the charge measurement unit 400 and the test result of the third test shows that breakdown occurs in the charge measurement unit 300, it can be determined that the operations for forming the dielectric layer 510b creates a voltage greater than the breakdown voltage of the charge measurement unit 300 and less than the breakdown voltage of the charge measurement unit 400.

If both of the test result of the third test or the fourth test shows that breakdown occurs, it can be determined that the operations for forming the dielectric layer 510b creates a voltage greater than the breakdown voltage of the charge measurement unit 300 and greater than the breakdown voltage of the charge measurement unit 400, and the method 100 ends. In some embodiments, since the charges accumulated on the charge receiving unit 200, the charge measurement unit 300 and/or the charge measurement unit 400 are drained prior to the forming of the metallization layer 520a, the test results of the third test and the fourth test indicate whether breakdown occurs due to the accumulated charges induced by the forming of the metallization layer 520a and the forming of the dielectric layer 510b. Hence, a semiconductor package manufactured by similar operations may induce a similar voltage in response to an electrostatic discharge (ESD) event. The test result provides a clue for determining the specification of an ESD protection circuit in a semiconductor package for shunting the induced charges on the semiconductor package to thereby avoid ESD damage. For example, if breakdown occurs in both charge measurement units 300 and 400, a protection voltage of the ESD protection circuit is determined to be greater than that of the charge measurement unit 400.

Figure 5G:
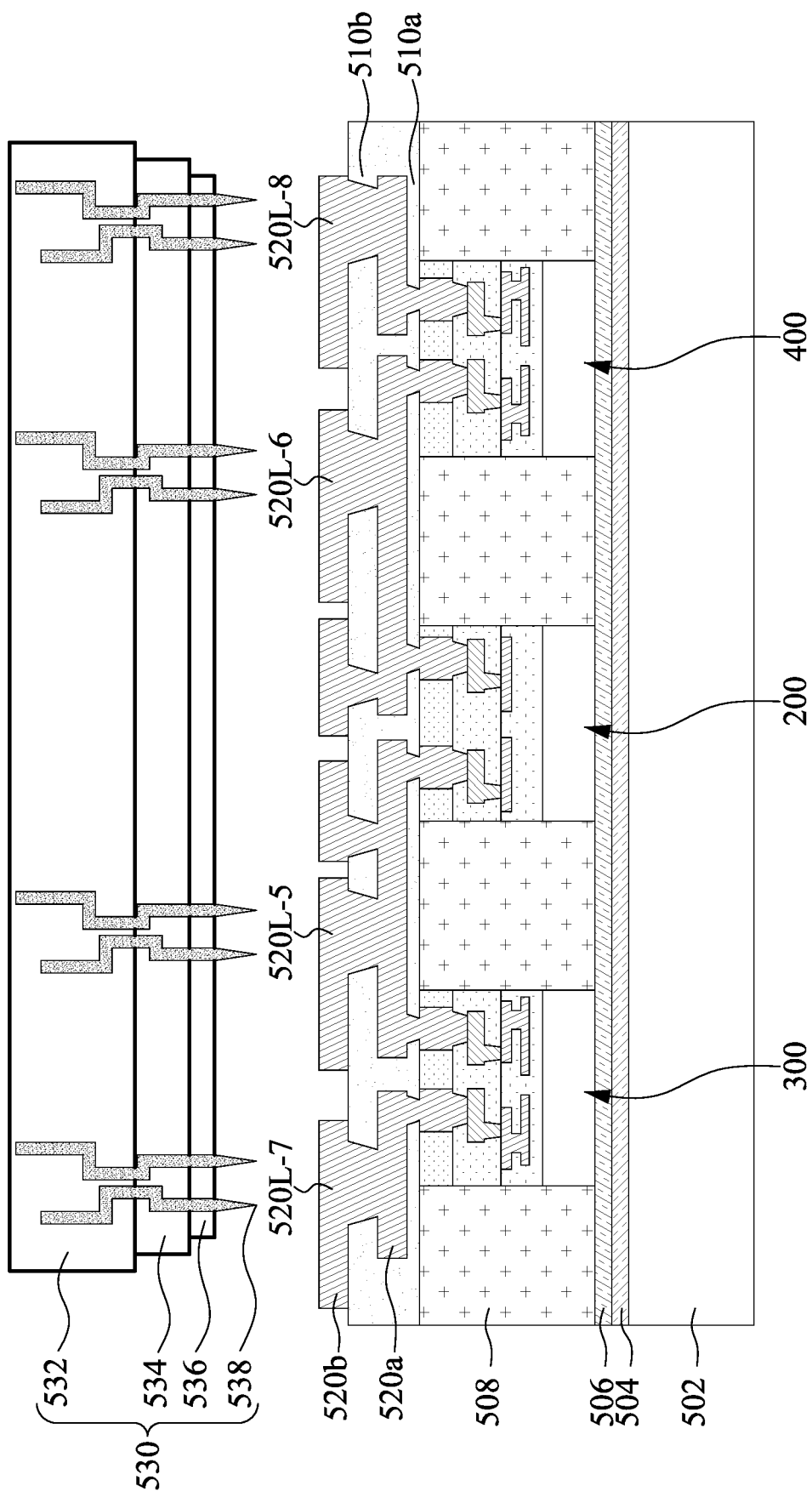

Referring to FIG. 5G, if at least one of the test result of the third test or the fourth test shows that no breakdown occurs, a metallization layer 520b is formed over the dielectric layer 510b. The formation of the metallization layer 520b may include depositing a seed layer (such as a titanium layer and an overlying copper layer, which are not shown) over the dielectric layer 510b. In some embodiments, the forming of the seed layer creates a conductive path for the induced charges previously accumulated on the charge receiving unit 200, the charge measurement unit 300 and/or the charge measurement unit 400. Thus, the previously induced charges can be easily drained. A patterned photo resist (not shown) is then formed over the seed layer, and a metallic material is plated in the patterned photo resist. The photo resist is then removed, and the portions of the seed layer covered by the photo resist are removed. The remaining portions of the plated metallic material form the metallization layer 520b. In some embodiments, the material of the metallization layer 520b and the forming method are substantially same as those of the metallization layer 520a.

Similarly, a fifth test and a sixth test are respectively performed against the charge measurement unit 300 and 400 through the conductive pads 520L-5, 520L-6, 520L-7 and 520L-8 of the metallization layer 520b to determine whether breakdown occurs in the charge measurement unit 300 and/or 400. In some embodiments, since the charges accumulated on the charge receiving unit 200, the charge measurement unit 300 and/or the charge measurement unit 400 are drained prior to the forming of the metallization layer 520b, the test results of the fifth test and the sixth test show whether breakdown occurs due to the accumulated charges induced by the forming of the metallization layer 520b only. In other words, the test results of the fifth test and the sixth test do not show whether breakdown occurs due to the accumulated charges induced by the forming of the dielectric layers 510a and 510b, and the forming of the metallization layer 520a and 520b. In some embodiments, the conductive pads 520L-5, 520L-6, 520L-7 and 520L-8 are offset from the corresponding conductive pads 520L-1, 520L-2, 520L-3 and 520L-4 along a direction parallel to a surface of the dielectric layer 510b.

Figure 5H:
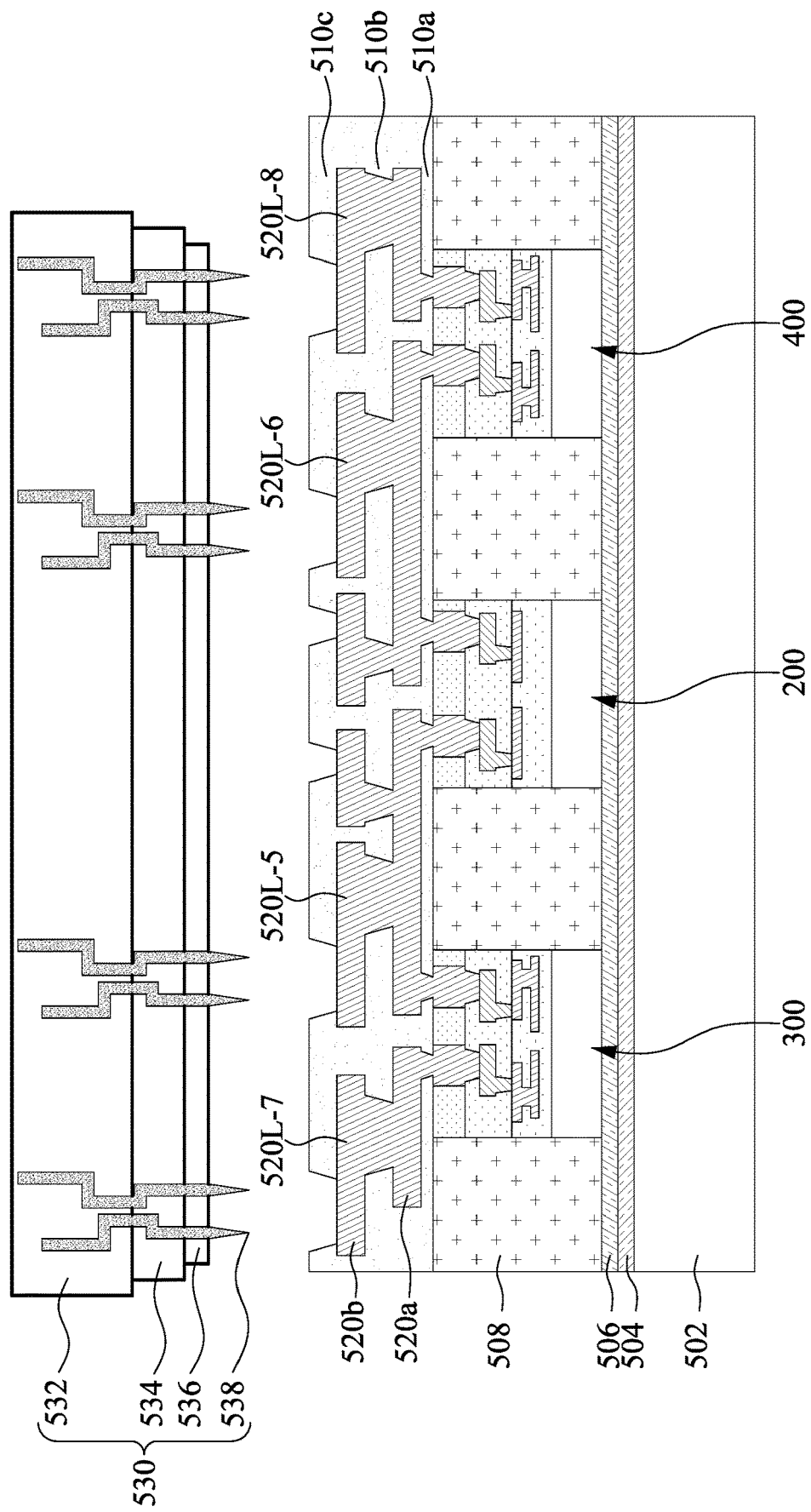

Referring to FIG. 5H, if at least one of the test result of the fifth test or the sixth test shows that no breakdown occurs, a dielectric layer 510c is formed over the metallization layer 520b. In some embodiments, a portion of the conductive pad 520L-5, 520L-6, 520L-7 or 520L-8 is exposed from the dielectric layer 510b. The dielectric layer 510c may be patterned using a photolithography and/or etching process and has openings that partially expose the conductive pads 520L-5, 520L-6, 520L-7 and 520L-8. In some embodiments, the material of the dielectric layer 510c and the forming method are substantially same as those of the dielectric layer 510a.

Similarly, a seventh test and an eighth test are respectively performed against the charge measurement unit 300 and 400 through the conductive pads 520L-5, 520L-6, 520L-7 and 520L-8 to determine whether breakdown occurs in the charge measurement unit 300 and 400. In some embodiments, since the charges accumulated on the charge receiving unit 200, the charge measurement unit 300 and/or the charge measurement unit 400 are drained prior to the forming of the metallization layer 520b, the test results of the seventh test and an eighth test show whether breakdown occurs due to the accumulated charges induced by the forming of the metallization layer 520b and the forming of the dielectric layer 510c.

Figure 5I:
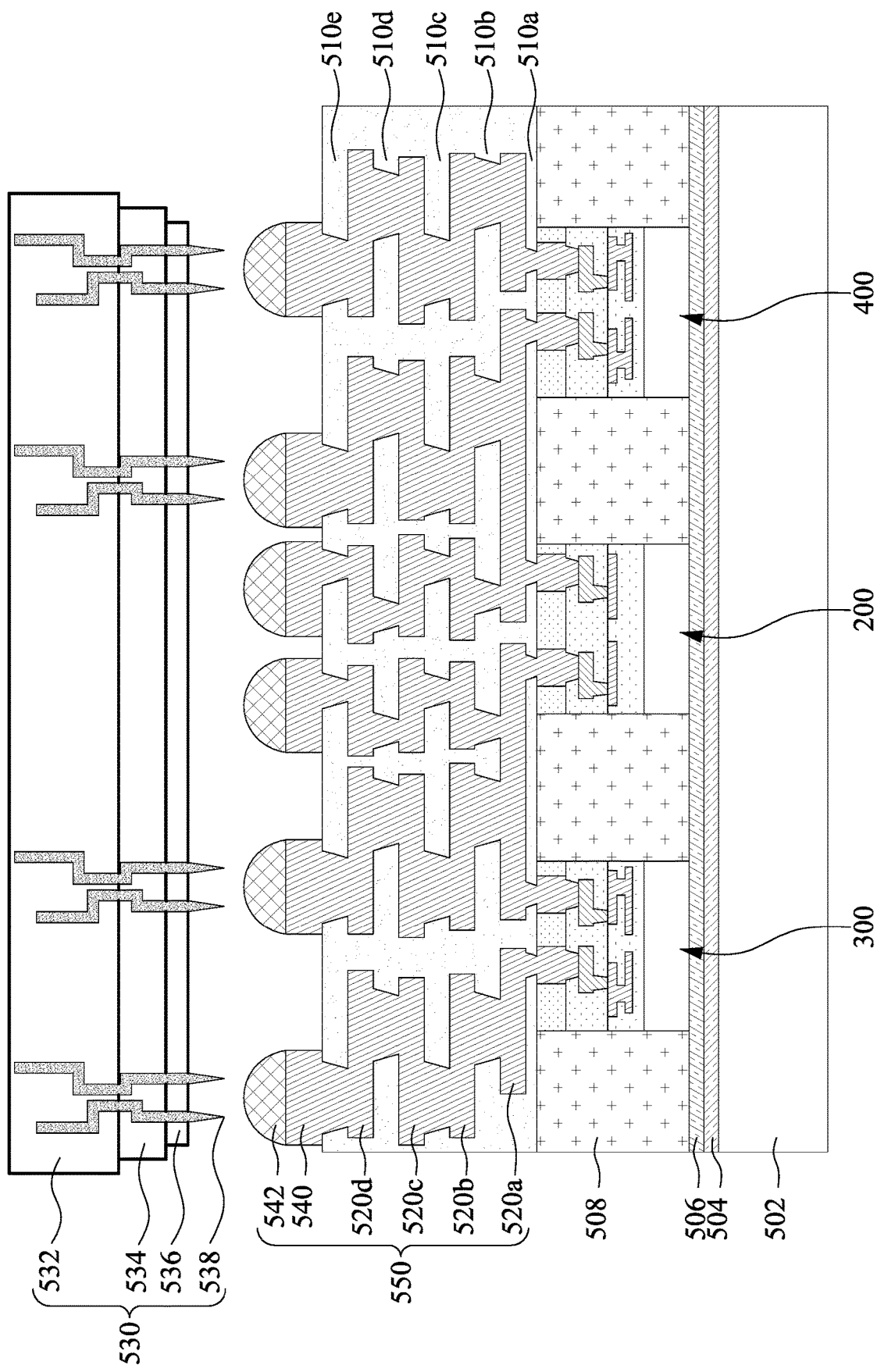

Referring to FIG. 5I, if at least one of the test result of the seventh test or the eighth test (and subsequent tests) shows that no breakdown occurs, operations similar to those shown in FIGS. 5F through 5H may be repeated to form the dielectric layers 510d and 510e and the metallization layers 520c and 520d. Furthermore, after forming the dielectric layer 510e, a plurality of conductive pads 540 may be disposed on an exposed top surface of the topmost layer of the metallization layer 520d for electrically connecting to conductive bumps 542. In some embodiments, the conductive pads 540 includes under-bump metallurgy (UBM) patterns used for bump mount. The conductive pads 540 are formed on and electrically connected to the metallization layer 520d. In some embodiments, the materials of the conductive pads 540 may include copper, nickel, titanium, tungsten, or alloys thereof or the like, and may be formed by an electroplating process, for example. The number of conductive pads 540 are not limited in this disclosure, and may be selected based on the design requirements.

Referring still to FIG. 5I, after forming the conductive pads 540, a plurality of conductive bumps 542 is disposed on the conductive pads 540. In some embodiments, the conductive bumps 542 may be disposed on the conductive pads 540 by a placement process and/or reflow process. In some embodiments, the conductive bumps 542 are, for example, control collapse chip connection (C4) bumps, solder bumps or ball grid array (BGA) balls. In some embodiments, the conductive bumps 542 are connected to the metallization layer 520d through the conductive pads 540. In certain embodiments, some of the conductive bumps 542 are electrically connected to the charge receiving unit 200, the charge measurement unit 300 and/or the charge measurement unit 400 through the metallization layer 520d. The number of the conductive bumps 542 is not limited to the disclosure, and may be designated and selected based on the number of the conductive pads 540. A redistribution structure 550 of an integrated fan-out (InFO) package is thus formed. The redistribution structure 550 includes the dielectric layers 510a-510e, metallization layers 520a-520d, the conductive pads 540 and the conductive bumps 542. The number of dielectric layers and the number of metallization layers in the redistribution structure 550 are merely non-limiting examples. Other numbers of the dielectric layers and other numbers of the metallization layers are also possible and are fully intended to be included within the scope of the present disclosure.

A ninth test and a tenth test are respectively performed against the charge measurement unit 300 and 400 through the conductive bumps 542 to determine whether breakdown occurs in the charge measurement unit 300 and 400. Furthermore, each of the conductive bumps 542 is in contact with two test probes 538 during the ninth test and the tenth test. If a test result (regarding whether breakdown occurs) shows that breakdown occurs in the charge measurement unit 300 and no breakdown occurs in the charge measurement unit 400, it can be determined that the operations for forming the redistribution structure 550 creates voltage greater than the breakdown voltage of the charge measurement unit 300 and less than the breakdown voltage of the charge measurement unit 400. Accordingly, an InFO package manufactured by similar operations may also induce such electrostatic discharge (ESD) events. In an InFO package, a redistribution structure is formed on a side of a semiconductor die and is electrically coupled to the semiconductor die. The test result provides a clue for determining the specification of an ESD protection circuit in a semiconductor package that include a similar redistribution structure, in an effort for preventing charges from accumulating on the semiconductor die to thereby avoid ESD damage. Hence, the protection voltage of the ESD protection circuit in the InFO package may be at least greater than the breakdown voltage of the charge measurement unit 300.

If a test result shows that no breakdown occurs in the charge measurement unit 300 and no breakdown occurs in the charge measurement unit 400, it can be determined that the operations for forming the redistribution structure 550 creates a voltage less than the breakdown voltage of the charge measurement unit 300 and less than the breakdown voltage of the charge measurement unit 400. The protection voltage of the ESD protection circuit of the InFO package may be greater than or substantially equal to the breakdown voltage of the charge measurement unit 300.

If a test result shows that breakdown occurs in the charge measurement unit 300 and breakdown occurs in the charge measurement unit 400, it can be determined that the operations for forming the redistribution structure 550 creates a voltage greater than the breakdown voltage of the charge measurement unit 300 and greater than the breakdown voltage of the charge measurement unit 400. The protection voltage of the ESD protection circuit of the InFO package may be greater than the breakdown voltage of the charge measurement unit 400.

Figure 6:
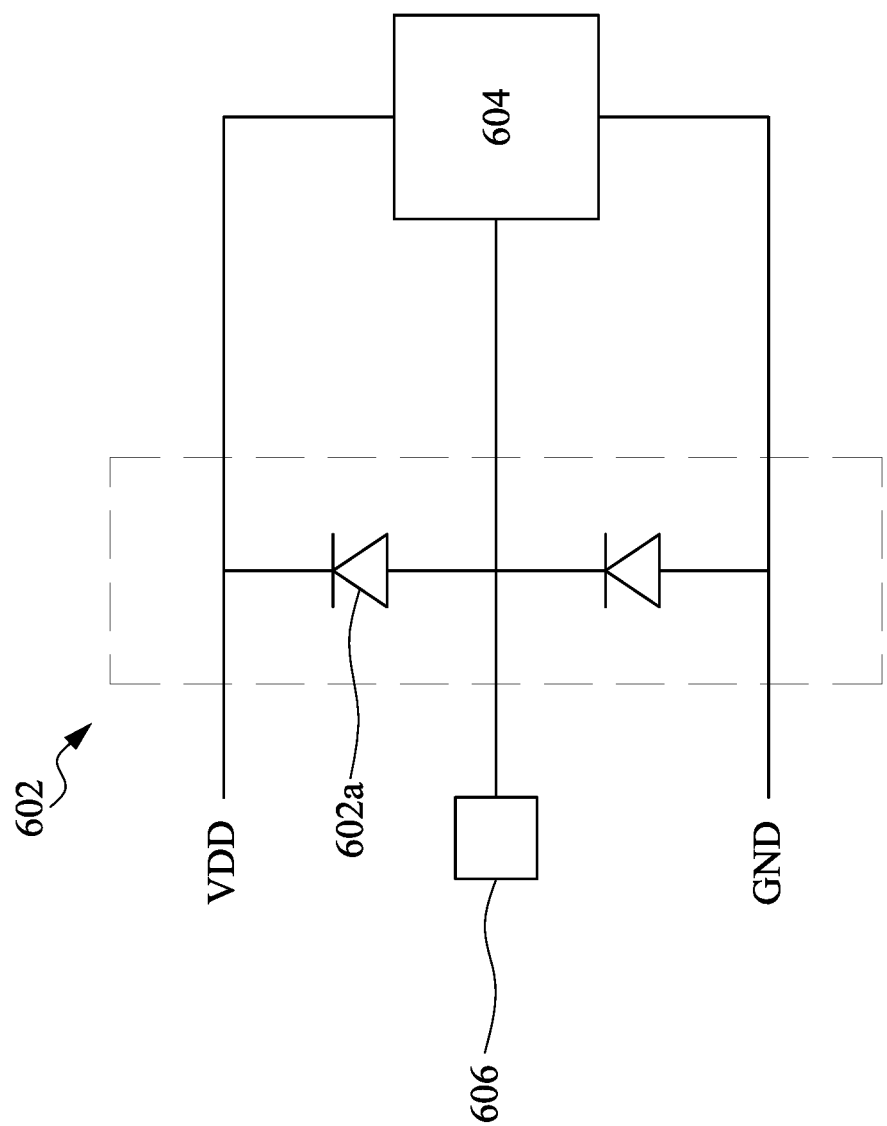
FIG. 6 is a circuit diagram showing an ESD protection circuit according to aspects of one or more embodiments of the present disclosure.

FIG. 6 is a circuit diagram showing an ESD protection circuit according to aspects of one or more embodiments of the present disclosure. As illustrated in FIG. 6, an ESD protection circuit 602 is electrically connected to a core circuit 604 of an integrated circuit (IC) in parallel for protecting the core circuit 604 of the IC from damage that may be caused by an ESD event, which may be generated during manufacturing of an InFO package. The core circuit 604 may be further connected to a first supply voltage, e.g., VDD, a second supply voltage, e.g., ground, and a signal pin 606, such as an input/output signal pin. In some embodiments, the ESD protection circuit 602 is formed of one or more diode devices 602a connected in series between the first supply voltage and the second supply voltage. The specification of the ESD protection circuit 602, e.g., the range of the protection voltage provided by the diode devices 602a, may be determined through the test results of the above-mentioned test steps.

The ESD protection circuit 602 may be operated under two modes: a normal mode and an ESD mode. During the normal operation mode, power is supplied to the core circuit 604 through the first supply voltage with a normal voltage level VDD. When the IC is operated under the normal mode, the ESD protection circuit 602 appears invisible to the IC since the diode devices 602a are turned off. When an ESD event occurs, the incoming voltage will be greater than the reverse bias of the diode devices 602a. As a result, the ESD protection circuit 602 is turned on to bypass the ESD current and protect the IC. The specification of the diode devices 602a as determined through help of the testing steps set forth in the present disclosure may help ensure proper functioning of the diode devices during the ESD event without sacrificing unnecessary chip area and power.

Figure 7A:
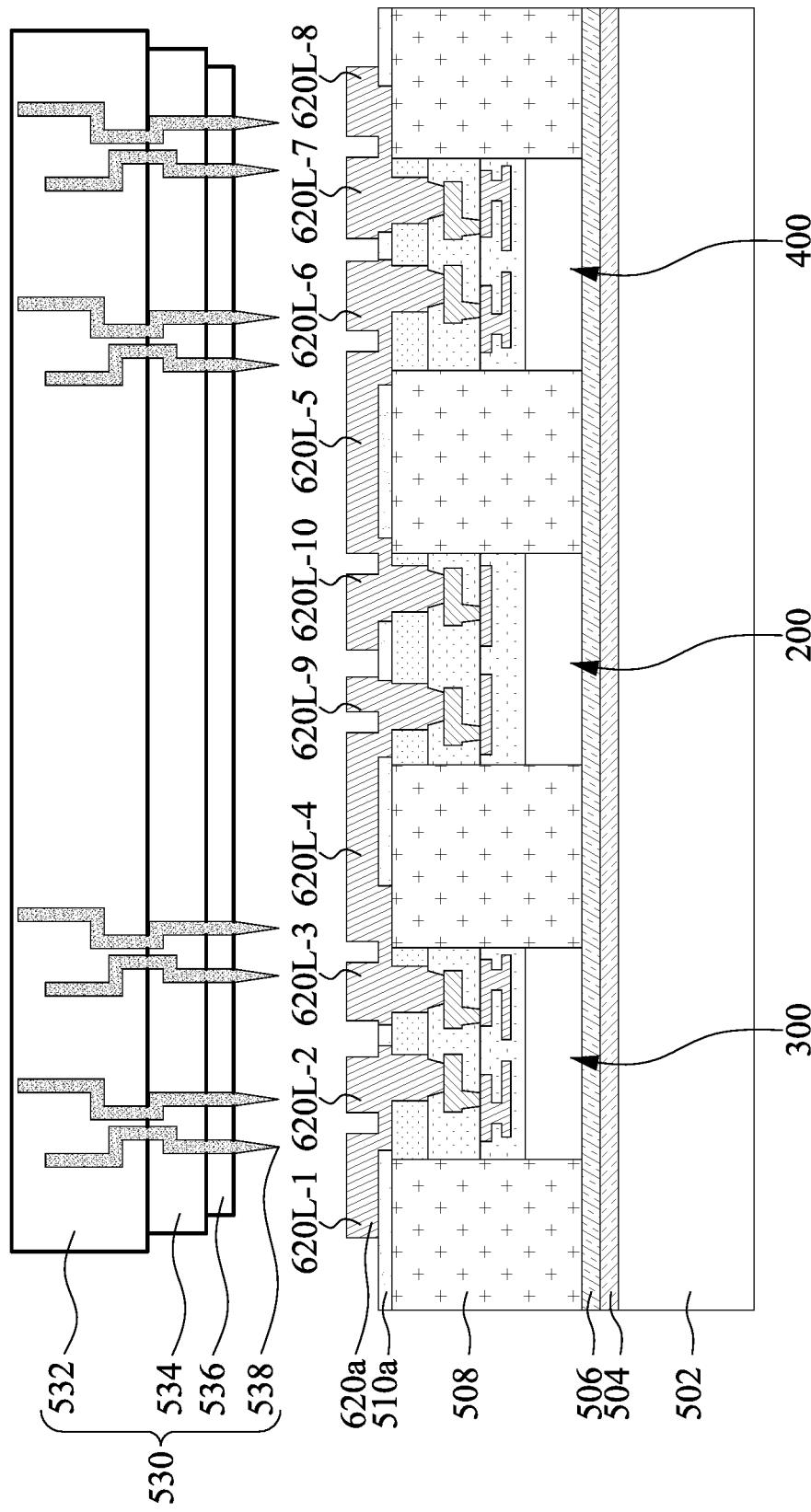
FIG. 7A is a schematic drawing of a cross-sectional view of a semiconductor package at a stage of a fabrication and testing method associated with the semiconductor package according to aspects of one or more embodiments of the present disclosure.

The structures of the present disclosure are not limited to the above-mentioned embodiments, and may have other different embodiments. FIG. 7A is a schematic drawing of a cross-sectional view of a semiconductor package at a stage of a fabrication and testing method associated with the semiconductor package according to aspects of one or more embodiments of the present disclosure. As illustrated in FIG. 7A, a metallization layer 620a is formed over the dielectric layer 510a. Different from FIG. 5E, the metallization layer 620a includes conductive pads 620L-1, 620L-2, 620L-3, 620L-4, 620L-5, 620L-6, 620L-7, 620L-8, 620L-9 and 620L-10. In some embodiments, each of the conductive pads 620L-1, 620L-2, 620L-3 and 620L-4 is in contact with one test probe 538 during the first test. The conductive pads 620L-1 and 620L-2 are configured as two-pad input terminals, while the conductive pads 620L-3 and 620L-4 are configured as two-pad output terminals during the first test. The two-pad input terminals or two-pad output terminals can help increase probing stability and the probability of successful contacting, thereby reducing the testing failure. In some embodiments, each of the conductive pads 620L-5, 620L-6, 620L-7 and 620L-8 is in contact with one test probe 538 during the second test. The conductive pads 620L-5 and 620L-6 are configured as two-pad input terminals, while the conductive pads 620L-7 and 620L-8 are configured as two-pad output terminals during the second test.

Figure 7B:
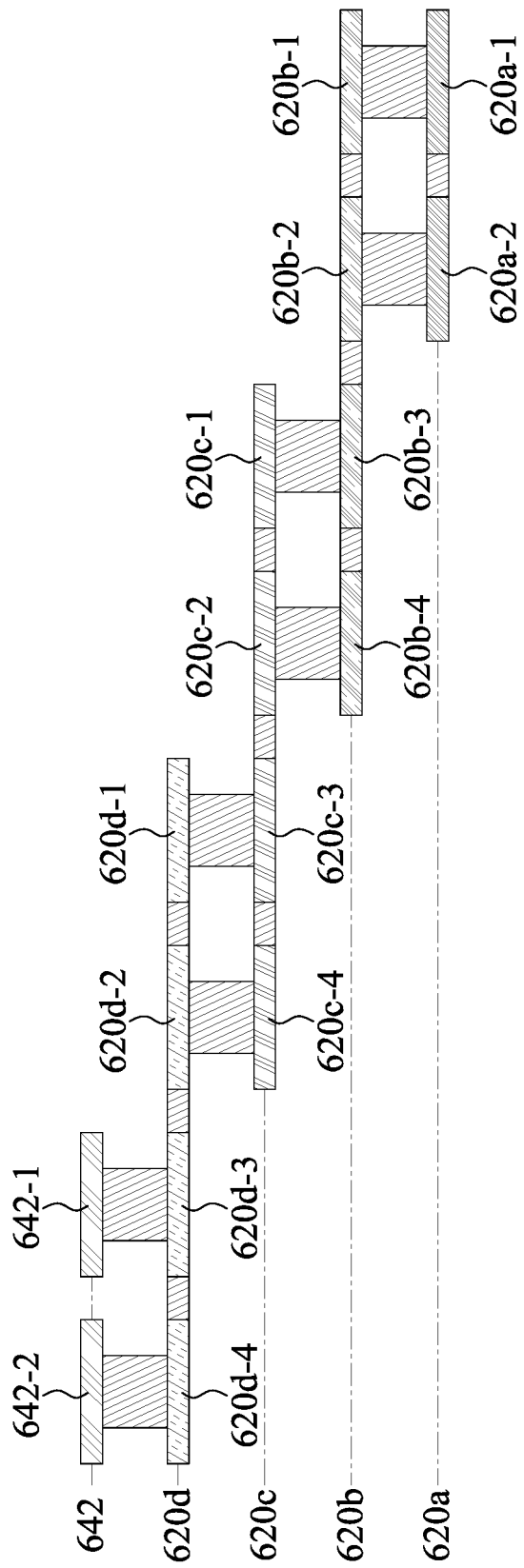
FIG. 7B is a cross-sectional view illustrating a semiconductor package at a fabrication stage subsequent to FIG. 7A constructed according to aspects of one or more embodiments of the present disclosure.

FIG. 7B is a cross-sectional view illustrating a semiconductor package at a fabrication stage subsequent to FIG. 7A constructed according to aspects of one or more embodiments of the present disclosure. For the purpose of simplicity and clarity, only the conductive patterns, e.g., the metallization layers and the conductive bumps, are shown in FIG. 7B. FIG. 7B illustrates an arrangement of the conductive pads of each metallization layers 620a, 620b, 620c, 620d and the conductive bumps 642. The metallization layers 620a, 620b, 620c, 620d and the conductive bumps 642 may correspond to the metallization layers 520a, 520b, 520c, 520d and the conductive bumps 542 as illustrated in FIG. 5I. Furthermore, the metallization layer 620a illustrated in FIG. 7B may correspond to the metallization layer 620a illustrated in FIG. 7A.

As shown in FIG. 7B, the metallization layer 620a includes conductive pads 620a-1 and 620a-2, which may respectively correspond to conductive pads 620L-1 and 620L-2 as illustrated in FIG. 7A. The metallization layer 620b includes conductive pads 620b-1, 620b-2, 620b-3 and 620b-4. The conductive pads 620b-1 and 620b-2 are vertically aligned with the conductive pads 620a-1 and 620a-2, while the conductive pads 620b-3 and 620b-4 are offset from the corresponding conductive pads 620a-1 and 620a-2. The metallization layer 620c includes conductive pads 620c-1, 620c-2, 620c-3 and 620c-4. The conductive pads 620c-1 and 620c-2 are vertically aligned with the conductive pads 620b-3 and 620b-4, while the conductive pads 620c-3 and 620c-4 are offset from the corresponding conductive pads 620b-3 and 620b-4. Similarly, the metallization layer 620d includes conductive pads 620d-1 and 620d-2 vertically aligned with the conductive pads 620c-3 and 620c-4, and conductive pads 620d-3 and 620d-4 offset from the conductive pads 620c-3 and 620c-4. The conductive bumps 642-1 and 642-2 may be vertically aligned with the conductive pads 620d-3 and 620d-4.

The embodiments of the present disclosure have some advantageous features. High-voltage static electricity or noise may arise during the intricate InFO package fabrication process. The present disclosure is generally directed to testing the voltages caused by the induced charges layer-by-layer during manufacturing of the semiconductor packages. The test result provides a clue for determining the specification of an ESD protection circuit in a semiconductor package having a similar redistribution structure in an effort to preventing induced charges from accumulating on the die to thereby avoid ESD damages.

In accordance with some embodiments of the present disclosure, a method of testing a semiconductor package is provided. The method includes providing a carrier substrate; disposing a charge measurement unit and a charge receiving unit over the carrier substrate; forming a first dielectric layer over the charge measurement unit and the charge receiving unit; forming a first metallization layer over the first dielectric layer, wherein the first metallization layer includes a first conductive pad electrically connected to the charge measurement unit and the charge receiving unit, wherein the forming of the first metallization layer induces first charges to accumulate on the charge measurement unit or charge receiving unit; performing a first test against the charge measurement unit through the first conductive pad to determine whether breakdown occurs in the charge measurement unit; and in response to determining that no breakdown occurs in the charge measurement unit, forming a second dielectric layer over the first metallization layer, wherein a portion of the first conductive pad is exposed from the second dielectric layer.

In accordance with some embodiments of the present disclosure, a method of testing a semiconductor package is provided. The method includes providing a carrier substrate having a first charge measurement unit, a second charge measurement unit and a charge receiving unit disposed thereon, wherein a first breakdown voltage of the first charge measurement unit is less than a second breakdown voltage of the second charge measurement unit; forming a first metallization layer over the first charge measurement unit and the second charge measurement unit, wherein the first metallization layer includes a first conductive pad electrically connected to the first charge measurement unit and the charge receiving unit, and a second conductive pad electrically connected to the second charge measurement unit and the charge receiving unit; performing a first test against the first charge measurement unit through the first conductive pad to determine whether breakdown occurs in the first charge measurement unit; performing a second test against the second charge measurement unit through the second conductive pad to determine whether breakdown occurs in the second charge measurement unit; and in response to determining that no breakdown occurs in the first charge measurement unit or the second charge measurement unit, forming a first dielectric layer over the first metallization layer, wherein a portion of the first conductive pad and a portion of the second conductive pad is exposed from the first dielectric layer.

In accordance with some embodiments of the present disclosure, a method of testing a semiconductor package is provided. The method includes providing a carrier substrate having a first charge measurement unit, a second charge measurement unit and a charge receiving unit disposed thereon, wherein a first breakdown voltage of the first charge measurement unit is different from a second breakdown voltage of the second charge measurement unit; forming a first metallization layer over a first dielectric layer by a first charge-induced process, wherein the first metallization layer includes a first conductive pad electrically connected to the first charge measurement unit and the charge receiving unit; performing a first test against the first charge measurement unit through the first conductive pad to determine whether breakdown occurs in the first charge measurement unit; in response to determining that no breakdown occurs in the first charge measurement unit, forming a second metallization layer over the first metallization layer by a second charge-induced process, wherein the second metallization layer includes a second conductive pad electrically connected to the first charge measurement unit and the charge receiving unit, and a third conductive pad electrically connected to the second charge measurement unit and the charge receiving unit; performing a second test against the first charge measurement unit or the second charge measurement unit to determine whether breakdown occurs in the first charge measurement unit or the second charge measurement unit; and in response to determining that no breakdown occurs in the first and second charge measurement units, forming a third metallization layer over the second metallization layer.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of testing a semiconductor package, comprising:
   providing a carrier substrate;
   disposing a charge measurement unit and a charge receiving unit over the carrier substrate;
   forming a first dielectric layer over the charge measurement unit and the charge receiving unit;

forming a first metallization layer over the first dielectric layer, wherein the first metallization layer includes a first conductive pad electrically connected to the charge measurement unit and the charge receiving unit, wherein the forming of the first metallization layer induces first charges to accumulate on the charge measurement unit or charge receiving unit;

performing a first test against the charge measurement unit through the first conductive pad to determine whether breakdown occurs in the charge measurement unit; and in response to determining that no breakdown occurs in the charge measurement unit, forming a second dielectric layer over the first metallization layer, wherein a portion of the first conductive pad is exposed from the second dielectric layer.

2. The method of claim 1, further comprising:

performing a second test against the charge measurement unit through the first conductive pad to determine whether breakdown occurs in the charge measurement unit; and in response to determining that no breakdown occurs in the charge measurement unit, forming a second metallization layer over the second dielectric layer.

3. The method of claim 2, wherein the second metallization layer includes a second conductive pad vertically offset from the first conductive pad.

4. The method of claim 2, further comprising:

forming a plurality of conductive bumps over the second dielectric layer and the second metallization layer, wherein the plurality of conductive bumps are electrically connected to the second metallization layer; and performing a third test against the charge measurement unit through the plurality of conductive bumps to determine whether breakdown occurs in the charge measurement unit.

5. The method of claim 1, wherein the first metallization layer further includes a third conductive pad electrically connected to the charge measurement unit.

6. The method of claim 5, wherein the first conductive pad is in contact with two first test probes and the third conductive pad is in contact with two second test probes during the first test, and the first conductive pad and the third conductive pad are respectively configured as input and output terminals during the first test.

7. The method of claim 5, wherein the first conductive pad is in contact with a first test probe and the third conductive pad is in contact with a second test probe during the first test, and the first conductive pad and the third conductive pad are both configured as input terminals during the first test.

8. The method of claim 5, wherein the performing of the first test further comprises determining whether a signal is transmitted between the first conductive pad and the third conductive pad.

9. The method of claim 1, wherein the charge receiving unit comprises a semiconductor substrate.

10. The method of claim 9, wherein the charge receiving unit further comprises a conductive mesh disposed over the semiconductor substrate.

11. A method of testing a semiconductor package, comprising:

providing a carrier substrate having a first charge measurement unit, a second charge measurement unit and a charge receiving unit disposed thereon, wherein a first breakdown voltage of the first charge measurement unit is less than a second breakdown voltage of the second charge measurement unit;

forming a first metallization layer over the first charge measurement unit and the second charge measurement unit, wherein the first metallization layer includes a first conductive pad electrically connected to the first charge measurement unit and the charge receiving unit, and a second conductive pad electrically connected to the second charge measurement unit and the charge receiving unit;

performing a first test against the first charge measurement unit through the first conductive pad to determine whether breakdown occurs in the first charge measurement unit;

performing a second test against the second charge measurement unit through the second conductive pad to determine whether breakdown occurs in the second charge measurement unit; and in response to determining that no breakdown occurs in the first charge measurement unit or the second charge measurement unit, forming a first dielectric layer over the first metallization layer, wherein a portion of the first conductive pad and a portion of the second conductive pad is exposed from the first dielectric layer.

12. The method of claim 11, further comprising:

forming the first dielectric layer over the first metallization layer in response to determining that no breakdown occurs in both of the first and second charge measurement units.

13. The method of claim 11, further comprising:

forming the first dielectric layer over the first metallization layer in response to determining that breakdown occurs only in the first charge measurement unit rather than in the second charge measurement unit.

14. The method of claim 11, further comprising determining a specification of an electrostatic discharge protection circuit according to a test result of the first test and the second test.

15. The method of claim 11, wherein the first charge measurement unit includes a first capacitor, the first capacitor includes a first electrode, a second electrode and a first dielectric layer between the first electrode and the second electrode.

16. The method of claim 15, wherein the second charge measurement unit includes two second capacitors connected in series, and each of the second capacitor includes a third electrode, a fourth electrode and a second dielectric layer between the third electrode and the fourth electrode, wherein a breakdown voltage of the first dielectric layer is identical to a breakdown voltage of the second dielectric layer.

17. A method of testing a semiconductor package, comprising:

providing a carrier substrate having a first charge measurement unit, a second charge measurement unit and a charge receiving unit disposed thereon, wherein a first breakdown voltage of the first charge measurement unit is different from a second breakdown voltage of the second charge measurement unit;

forming a first metallization layer over a first dielectric layer by a first charge-induced process, wherein the first metallization layer includes a first conductive pad electrically connected to the first charge measurement unit and the charge receiving unit;

performing a first test against the first charge measurement unit through the first conductive pad to determine whether breakdown occurs in the first charge measurement unit;

in response to determining that no breakdown occurs in the first charge measurement unit, forming a second metallization layer over the first metallization layer by a second charge-induced process, wherein the second metallization layer includes a second conductive pad electrically connected to the first charge measurement unit and the charge receiving unit, and a third conductive pad electrically connected to the second charge measurement unit and the charge receiving unit;

performing a second test against the first charge measurement unit or the second charge measurement unit to determine whether breakdown occurs in the first charge measurement unit or the second charge measurement unit; and in response to determining that no breakdown occurs in the first and second charge measurement units, forming a third metallization layer over the second metallization layer.

18. The method of claim 17, further comprising:

performing a third test against the first charge measurement unit or the second charge measurement unit to determine whether breakdown occurs in the first charge measurement unit or the second charge measurement unit.

19. The method of claim 17, wherein a breakdown occur in the first charge measurement unit prior to the second charge measurement unit.

20. The method of claim 17, wherein the first charge measurement unit and the second charge measurement unit respectively include a conductive mesh.

* * * * *